US009042162B2

(12) United States Patent
Lee et al.

(10) Patent No.: US 9,042,162 B2
(45) Date of Patent: May 26, 2015

(54) SRAM CELLS SUITABLE FOR FIN FIELD-EFFECT TRANSISTOR (FINFET) PROCESS

(71) Applicant: Marvell World Trade Ltd., St. Michael (BB)

(72) Inventors: Peter Lee, Pleasanton, CA (US); Winston Lee, Palo Alto, CA (US)

(73) Assignee: Marvell World Trade Ltd., St. Michael (BB)

( * ) Notice: Subject to any disclaimer, the term of this patent is extended or adjusted under 35 U.S.C. 154(b) by 36 days.

(21) Appl. No.: 14/066,817

(22) Filed: Oct. 30, 2013

(65) Prior Publication Data
US 2014/0119103 A1    May 1, 2014

Related U.S. Application Data

(60) Provisional application No. 61/720,753, filed on Oct. 31, 2012.

(51) Int. Cl.
*G11C 11/00* (2006.01)
*G11C 11/419* (2006.01)
*G11C 11/412* (2006.01)

(52) U.S. Cl.
CPC ............ *G11C 11/419* (2013.01); *G11C 11/412* (2013.01)

(58) Field of Classification Search
CPC ........ G11C 11/412; G11C 19/28; G11C 5/06; G11C 7/065; H01L 27/11; G06F 17/5068
USPC .............. 365/49.1, 49.11, 154, 189.011, 190, 365/203
See application file for complete search history.

(56) References Cited

U.S. PATENT DOCUMENTS 5,392,235 A    2/1995   Nishitani et al.
5,706,226 A    1/1998   Chan et al.
(Continued)

FOREIGN PATENT DOCUMENTS

EP    0011448 A1    5/1980
EP    1426975 A2    6/2004
(Continued)

OTHER PUBLICATIONS

Synopsys Insight Newsletter; FinFET: The Promises and the Challenges; Issue 3, 2012; 5 pages.
(Continued)

*Primary Examiner* — Fernando Hidalgo

(57) ABSTRACT

A static random access memory (SRAM) cell includes first and second n-channel transistors, first and second p-channel transistors, first and second enable transistors, and first and second pass gates. The first n-channel transistor, the first p-channel transistor, and the first enable transistor are connected in series between first and second reference potentials. The second n-channel transistor, the second p-channel transistor, and the second enable transistor are connected in series between the first and second reference potentials. The first pass gate is configured to selectively connect a first bitline to a first node. The first node is connected to a gate of the first n-channel transistor and a gate of the first p-channel transistor. The second pass gate is configured to selectively connect a second bitline to a second node. The second node is connected to a gate of the second n-channel transistor and a gate of the second p-channel transistor.

16 Claims, 19 Drawing Sheets

(56) References Cited

U.S. PATENT DOCUMENTS

| | | | |
|---|---|---|---|
| 6,671,197 B2 | 12/2003 | Athanassiadis | |
| 7,495,944 B2 | 2/2009 | Parkinson et al. | |
| 7,499,349 B2 | 3/2009 | Roehr | |
| 7,570,524 B2 | 8/2009 | Bedeschi et al. | |
| 7,835,171 B2 | 11/2010 | Ono et al. | |
| 7,903,448 B2 | 3/2011 | Oh et al. | |
| 8,059,448 B2 | 11/2011 | Tanigami et al. | |
| 8,064,241 B2 | 11/2011 | Morita et al. | |
| 8,760,927 B2 * | 6/2014 | Deng | 365/185.18 |
| 8,817,528 B2 * | 8/2014 | Otto et al. | 365/154 |
| 2004/0252548 A1 | 12/2004 | Tsukamoto et al. | |
| 2008/0310221 A1 | 12/2008 | Baker | |
| 2009/0243652 A1 | 10/2009 | Dorairaj et al. | |
| 2009/0303785 A1 | 12/2009 | Hwang et al. | |
| 2010/0097844 A1 | 4/2010 | Liu | |
| 2010/0110762 A1 | 5/2010 | Chen et al. | |
| 2010/0142245 A1 | 6/2010 | Kitagawa | |
| 2010/0157706 A1 | 6/2010 | Cho et al. | |
| 2010/0259968 A1 | 10/2010 | Tsushima et al. | |
| 2010/0296334 A1 | 11/2010 | Houston et al. | |
| 2010/0296336 A1 | 11/2010 | Houston | |
| 2011/0007553 A1 | 1/2011 | Takagi et al. | |
| 2011/0051499 A1 | 3/2011 | Hamilton | |
| 2011/0228599 A1 | 9/2011 | Tian et al. | |
| 2012/0014171 A1 | 1/2012 | Chuang et al. | |
| 2012/0063196 A1 | 3/2012 | Kim et al. | |
| 2012/0087175 A1 | 4/2012 | Zhu et al. | |
| 2012/0140552 A1 | 6/2012 | Seikh et al. | |
| 2012/0155151 A1 | 6/2012 | Rachamadugu et al. | |
| 2014/0003126 A1 | 1/2014 | Huang | |
| 2014/0104926 A1 | 4/2014 | Sutardja et al. | |
| 2014/0104927 A1 | 4/2014 | Sutardja et al. | |
| 2014/0112057 A1 | 4/2014 | Sutardja et al. | |
| 2014/0133217 A1 | 5/2014 | Lee et al. | |

FOREIGN PATENT DOCUMENTS

| | | | |
|---|---|---|---|
| EP | 2063467 A1 | 5/2009 | |
| WO | WO-2007138646 A1 | 12/2007 | |
| WO | WO-2009013819 A1 | 1/2009 | |

OTHER PUBLICATIONS

U.S. Appl. No. 14/066,796, Winston Lee et al.
U.S. Appl. No. 14/050,678, Pantas Sutardja et al.
U.S. Appl. No. 14/050,696, Pantas Sutardja et al.
U.S. Appl. No. 14/059,790, Pantas Sutardja et al.
Notification of Transmittal of The International Search Report and The Written Opinion of The International Searching Authority, or The Declaration dated Feb. 3, 2014 in reference to PCT/US2013/067454 (13 pgs).
Xu Wang et al: "A nove l l ow power 64-kb SRAM using bit-lines charge-recycling and non-uniform cell scheme", Electronics, Circuits and Systems (ICECS), 2011 18th IEEE International Conference on, IEEE, Dec. 11, 2011, pp. 528-531.
International Search Report for PCT Application No. 2013/064811 mailed Dec. 6, 2014; 3 Pages.
International Search Report for PCT/US2013/064819 dated Feb. 11, 2014; 7 Pages.
International Search Report for related PCT Application No. PCT/US2013/066303; May 16, 2014; 6 pages.
International Search Report for related PCT Application No. PCT/US2013/067441; Jan. 23, 2014; 7 pages.

* cited by examiner

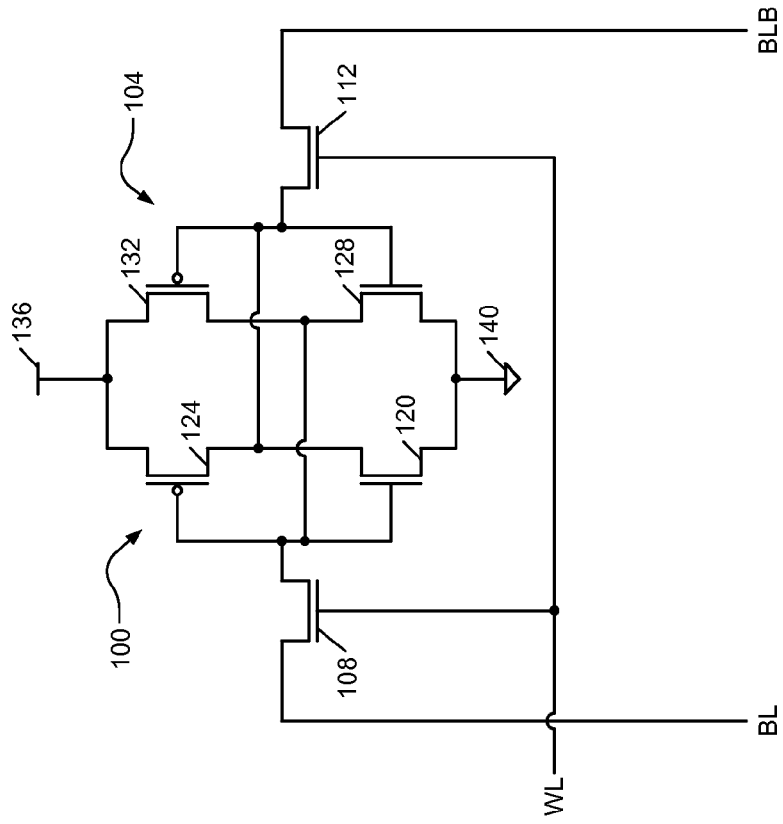
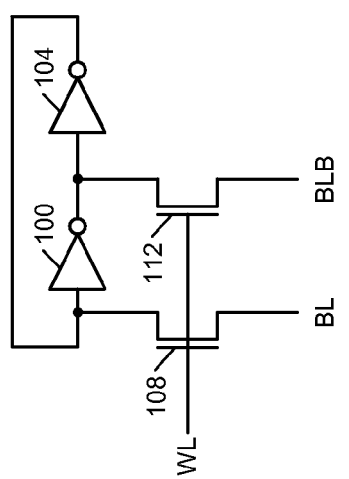
FIG. 1B
Prior Art
FIG. 1A
Prior Art

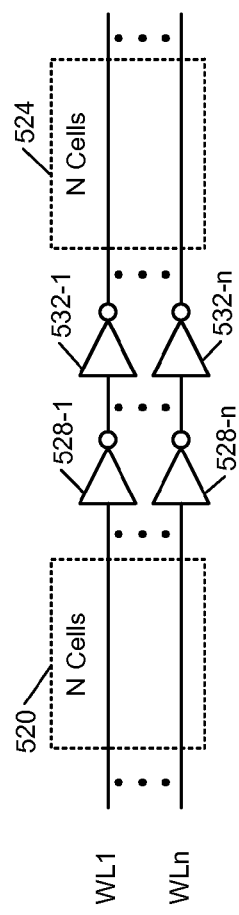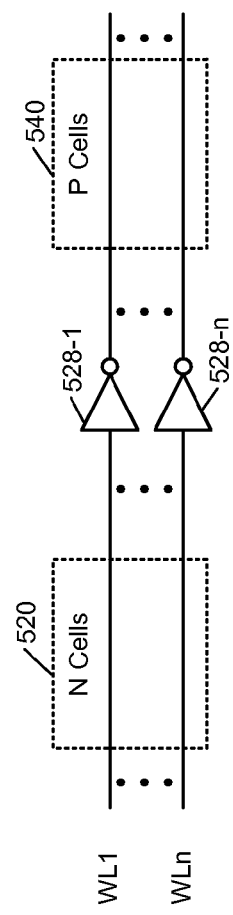

Reading from a Cell

Reading from a Cell

US 9,042,162 B2

SRAM CELLS SUITABLE FOR FIN FIELD-EFFECT TRANSISTOR (FINFET) PROCESS

CROSS-REFERENCE TO RELATED APPLICATIONS

This application claims the benefit of U.S. Provisional Application No. 61/720,753, filed on Oct. 31, 2012. The entire disclosure of the application referenced above is incorporated herein by reference.

This application is related to U.S. patent application Ser. No. 14/066,796, filed on Oct. 30, 2013, entitled, "Concurrent Use of SRAM Cells With Both NMOS and PMOS Pass Gates In A Memory System". The entire disclosure of the application referenced above is incorporated herein by reference.

FIELD

The present disclosure relates to SRAM cells and more particularly to SRAM cells that are suitable for FinFET processes.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

FIG. 1A shows a traditional static random access memory (SRAM) cell in which a bi-stable feedback loop retains a single bit of information without having to be periodically refreshed, such as is necessary for a dynamic random access memory (DRAM). In standard six-transistor SRAM cells, an output of a first inverter 100 is connected to an input of a second inverter 104 while an output of the second inverter 104 is connected to an input of the first inverter 100. As long as power is supplied to the first and second inverters 100 and 104, the SRAM cell will retain the single bit of information.

Either the output of the first inverter 100 or the output of the second inverter 104 is considered to be the single bit of information. For example, a high voltage at the output of the second inverter 104 may correspond to a digital one while a low voltage at the output of the second inverter 104 may correspond to a digital zero. In order to change the state of the SRAM cell, the inputs to both the first and second inverters 100 and 104 are operated on by a bitline (BL) and an inverted bitline (also called bitline bar, or BLB), respectively. The bitline and inverted bitline apply signals to the first and second inverters 100 and 104 via pass gates 108 and 112, respectively. The pass gates 108 and 112 are controlled by a wordline and are implemented as n-channel metal-oxide-semiconductor field-effect transistors (MOSFETs), each including a gate terminal ("gate"), a drain terminal ("drain"), and a source terminal ("source").

The schematics are drawn so that, for n-channel transistors, the source terminal is positioned below the drain terminal. Conversely, p-channel transistors, which each include a gate, a drain, and a source, are drawn so that the source terminal is positioned above the drain terminal. For horizontally-drawn transistors, both p-channel and n-channel, the source terminal is positioned to the left of the drain terminal.

In FIG. 1B, the first and second inverters 100 and 104 are shown to simply be two-transistor complementary metal-oxide-semiconductor (CMOS) inverters. The first inverter 100 includes an n-channel MOSFET (NMOS) 120 and a p-channel MOSFET (PMOS) 124 connected in series. The second inverter 104 includes an NMOS 128 and a PMOS 132 connected in series. Sources of the PMOS 124 and the PMOS 132 are connected to a first reference potential 136, such as $V_{DD}$. Sources of the NMOS 120 and the NMOS 128 are connected to a second reference potential 140, such as $V_{SS}$ or ground.

FIGS. 2A-2D are graphical depictions of writing—i.e., changing the SRAM cell from one state to the other. In FIG. 2A, gates of the NMOS 120 and the PMOS 124 are "low" (i.e., at the second reference potential 140), which turns the PMOS 124 on (indicated with thicker lines) and the NMOS 120 off (indicated with broken lines). The PMOS 124 therefore holds a first node between the PMOS 124 and the NMOS 120 "high" (i.e., at the first reference potential 136).

As a result, the high voltage is applied to the gates of the PMOS 132 and the NMOS 128, turning on the NMOS 128 and turning off the PMOS 132. This causes a second node between the PMOS 132 and the NMOS 128 to be pulled low by the NMOS 128, which then feeds back to the gates of the PMOS 124 and the NMOS 120. To change the state of the SRAM cell, the bitline and the inverted bitline are driven to new values of high and low, respectively.

In FIG. 2B, the wordline is asserted, which turns on (or, enables) the pass gates 108 and 112. This connects the high voltage on the bitline to the low voltage at the gates of the NMOS 120 and the PMOS 124; in addition, the low voltage of the inverted bitline is connected to the high voltage at the gates of the NMOS 128 and the PMOS 132. As a result, the pass gate 112 attempts to pull the second node low while the PMOS 124 attempts to pull the second node high. Traditional SRAM cells are sized so that the pass gate 112 is stronger (i.e., being able to source or sink more current) than the PMOS 124. Write margin is primarily determined by the relative strengths of an NMOS pass gate and a PMOS. Pull up of the first node is primarily the result of pull down of the second node caused by the pass gate 112. Also, the NMOS 120 and the NMOS 128 are sized to be stronger than the pass gates 112 and 108 for stability reasons.

Similarly, if the opposite value were being written to the SRAM cell, the pass gate 108 would need to be stronger than the PMOS 132. Relative strengths may be determined by width-to-length ratios, with a higher width-to-length ratio meaning that the transistor is stronger. However, for a given width-to-length ratio, an NMOS may be stronger than a PMOS.

In FIG. 2C, assuming that the transistors are sized correctly, the first node is pulled high toward the bitline while the second node is pulled low towards the inverted bitline. This results in turning on the NMOS 120 and the PMOS 132 while turning off the NMOS 128 and PMOS 124. However, as voltage supplies (the difference between the first reference potential 136 and the second reference potential 140) decrease, manufacturing defects and process variations may cause some of the SRAM cells to fail to function adequately.

For example, in one or more SRAM cells of a memory chip, the nodes may not transition quickly enough in order for data to be latched repeatably at a desired clock speed. The chip may be binned to a lower clock speed, may be discarded, or may have a mechanism for avoiding using the underperforming cells. This reduces yield and therefore increases cost. In fact, the nodes may not transition at all regardless of clock speed if process variation is too great such that a PMOS is stronger than an NMOS pass gate.

In FIG. 2D, the wordline is de-asserted, and the NMOS 120 and the PMOS 132 maintain the voltages at the first and second nodes against any parasitic leakage.

SUMMARY

A static random access memory (SRAM) cell includes first and second n-channel transistors, first and second p-channel transistors, first and second enable transistors, and first and second pass gates. The first n-channel transistor, the first p-channel transistor, and the first enable transistor are connected in series between a first reference potential and a second reference potential. The second n-channel transistor, the second p-channel transistor, and the second enable transistor are connected in series between the first reference potential and the second reference potential. The first pass gate is configured to selectively connect a first bitline to a first node. The first node is connected to a gate of the first n-channel transistor and a gate of the first p-channel transistor. The second pass gate is configured to selectively connect a second bitline to a second node. The second node is connected to a gate of the second n-channel transistor and a gate of the second p-channel transistor.

In further features, the first pass gate and the second pass gate are controlled by a wordline. In other features, the first pass gate comprises a first pass transistor, and the second pass gate comprises a second pass transistor. In further features, the first bitline is connected to a gate of the first enable transistor, and the second bitline is connected to a gate of the second enable transistor.

In other features, while the SRAM cell is not being read from or written to, (i) the first bitline is driven to a voltage level that enables the first enable transistor and (ii) the second bitline is driven to a voltage level that enables the second enable transistor. In further features, either (i) the first enable transistor is located between the first n-channel transistor and the first p-channel transistor, and the second enable transistor is located between the second n-channel transistor and the second p-channel transistor; or (ii) the first enable transistor is located between the first p-channel transistor and the first reference potential, and the second enable transistor is located between the second p-channel transistor and the first reference potential.

In further features, the first reference potential is $V_{DD}$ and the second reference potential is one of ground and $V_{SS}$. In other features, the second reference potential is $V_{DD}$ and the first reference potential is one of ground and $V_{SS}$. In further features, the first pass gate comprises a third n-channel transistor, and the second pass gate comprises a fourth n-channel transistor.

A method of operating a static random access memory (SRAM) cell including a bitline, an inverted bitline, and a wordline is disclosed. The method includes, in response to receiving a read request for the SRAM cell, (i) floating the bitline and the inverted bitline, (ii) asserting the wordline, (iii) determining a state of the SRAM cell from the bitline and the inverted bitline, (iv) de-asserting the wordline, and (v) responding to the read request based on the determined state of the SRAM cell. The method further includes, in response to receiving a write request for the SRAM cell, (i) driving the bitline and the inverted bitline according to a value provided in the write request, (ii) asserting the wordline, and (iii) de-asserting the wordline subsequent to asserting the wordline. The method further includes, subsequent to de-asserting the wordline, driving the bitline and the inverted bitline to a predetermined voltage until a subsequent read or write request is received.

In other features, the SRAM cell includes a pair of cross-coupled inverters and a pair of enable transistors. The predetermined voltage is calculated to turn on the enable transistors. In further features, the pair of enable transistors are p-channel field-effect transistors. The predetermined voltage is a low voltage. In other features, the low voltage is a ground potential.

A method of operating a memory cell including a bitline, an inverted bitline, and a wordline is disclosed. The method includes receiving a request to read from the memory cell and, in response to the request, performing a plurality of iterations of asserting the wordline and de-asserting the wordline. The method also includes, subsequent to a final one of the plurality of iterations, determining a state of the memory cell based on a voltage difference between the bitline and the inverted bitline. The method further includes returning data based on the state of the memory cell in answer to the request.

In other features, the memory cell is a static random access memory (SRAM) cell. For each one of the plurality of iterations, the wordline is asserted for a first predetermined period of time and the wordline is de-asserted for a second predetermined period of time. In further features, the first predetermined period of time is different than the second predetermined period of time. The first predetermined period of time is less than a period of time required for the state of the memory cell to change. The second predetermined period of time is greater than a period of time for internal nodes of the memory cell to achieve stable voltages.

In other features, the memory cell includes a pair of cross-coupled inverters, and the second predetermined period of time is greater than a period of time for outputs of the pair of cross-coupled inverters to be driven to stable voltages from intermediate voltages. In further features, the plurality of iterations is a first number of iterations. A product of the first number and the first predetermined period of time is greater than a period of time for the voltage difference between the bitline and the inverted bitline to exceed a predetermined threshold. The predetermined threshold is based on a predetermined read margin of the memory cell.

A memory system includes a control circuit and a plurality of memory cells including a first memory cell. The first memory cell is configured to be controlled by the control circuit through a wordline. The first memory cell is associated with a bitline connected to the control circuit and an inverted bitline connected to the control circuit. The control circuit is configured to receive a request to read from the first memory cell and, in response to the request, perform a plurality of iterations of asserting the wordline and de-asserting the wordline. The control circuit is further configured to, subsequent to a final one of the plurality of iterations, determine a state of the first memory cell based on a voltage difference between the bitline and the inverted bitline. The control circuit is further configured to return data based on the state of the first memory cell in answer to the request.

In other features, the plurality of memory cells are a plurality of static random access memory (SRAM) cells. For each one of the plurality of iterations, the control circuit is configured to assert the wordline for a first predetermined period of time and de-assert the wordline for a second predetermined period of time. In further features, the first predetermined period of time is different than the second predetermined period of time. The first predetermined period of time is less than a period of time required for the state of the first memory cell to change. The second predetermined period of time is greater than a period of time for internal nodes of the first memory cell to achieve stable voltages.

In further features, the first memory cell includes a pair of cross-coupled inverters. The second predetermined period of time is greater than a period of time for outputs of the pair of cross-coupled inverters to be driven to stable voltages from intermediate voltages. The plurality of iterations is a first number of iterations. A product of the first number and the first predetermined period of time is greater than a period of time for the voltage difference between the bitline and the inverted bitline to exceed a predetermined threshold. The predetermined threshold is based on a predetermined read margin of the first memory cell.

A static random access memory (SRAM) cell includes a first n-channel fin field-effect transistor ("NFET") and a first p-channel fin field-effect transistor ("PFET") connected in series between a first reference potential and a second reference potential. The SRAM cell also includes a second NFET and a second PFET are connected in series between the first reference potential and the second reference potential. The SRAM cell also includes first and second pass gates. The first pass gate is configured to selectively connect a first bitline to a first node. The first node is connected to a gate of the first NFET and a gate of the first PFET. The second pass gate is configured to selectively connect a second bitline to a second node. The second node is connected to a gate of the second NFET and a gate of the second PFET. The first NFET and the second NFET each have a first number of fins. The first PFET and the second PFET each have a second number of fins. The first number of fins is different than the second number of fins.

In other features, the first number of fins is greater than the second number of fins. The first pass gate includes a third NFET, the second pass gate includes a fourth NFET, the third NFET and the fourth NFET each have a third number of fins, and the third number of fins is greater than the second number of fins. The first number of fins is 2 and the second number of fins is 1. In further features, the first number of fins is 2, the second number of fins is 1, and the third number of fins is 2.

In other features, the first number of fins is smaller than the second number of fins. The first pass gate includes a third PFET, the second pass gate includes a fourth PFET, the third PFET and the fourth PFET each have a third number of fins, and the third number of fins is greater than the first number of fins. The first number of fins is 1 and the second number of fins is 2. In further features, the first number of fins is 1, the second number of fins is 2, and the third number of fins is 2.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF DRAWINGS

FIGS. 1A and 1B are functional schematics of a traditional SRAM cell.

FIG. 9A is an example of wordline buffers between groups of memory cells.

FIG. 9B is an example of alternative wordline buffer implementations for alternating types of pass gates.

In the drawings, reference numbers may be reused to identify similar and/or identical elements.

DESCRIPTION

Figure 3B:
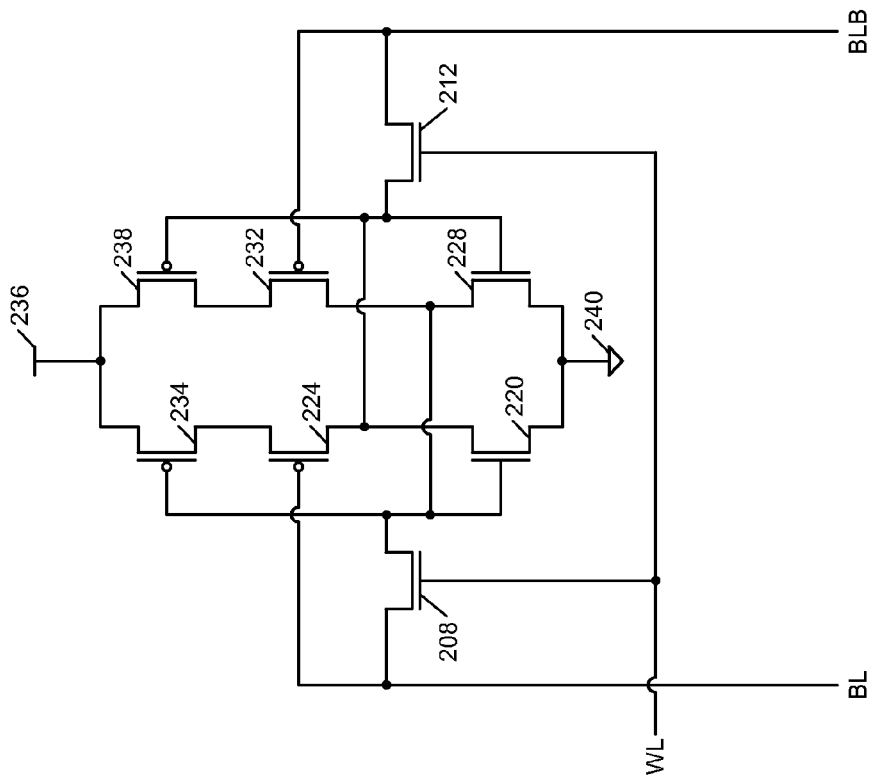
FIGS. 3A and 3B are example implementations of a modified SRAM cell using n-channel pass gates according to the principles of the present disclosure.
Figure 3A:
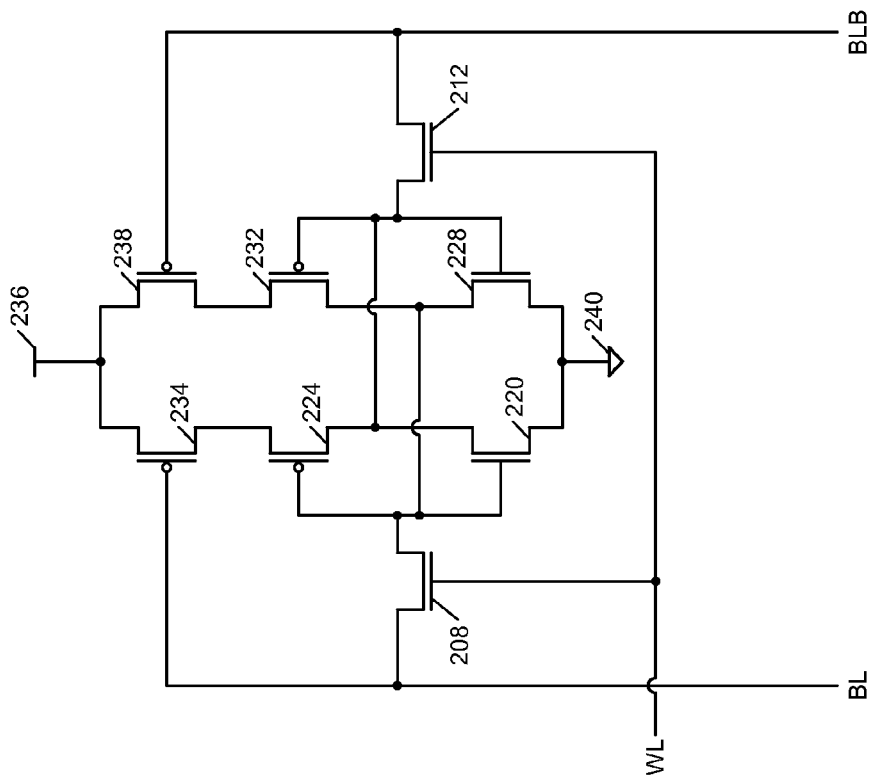

FIG. 3A shows a modified static random access memory (SRAM) cell according to the principles of the present disclosure. First and second pass gates 208 and 212 are controlled by a wordline. In various implementations, the pass gates 208 and 212 may be implemented as n-channel transistors, as shown in FIG. 3A. The pass gates 208 and 212 may also be referred to as pass transistors, transmission gates, or access devices. In other implementations, the pass gates 208 and 212 may each be implemented as a two-transistor CMOS transmission gate at the expense of increased area.

The pass gate 208 selectively connects a bitline to a first node, while the pass gate 212 selectively connects an inverted bitline to a second node. The first node is attached to control terminals of an n-channel transistor 220 and a p-channel transistor 224, which are connected in series. The second node is connected to control terminals of an n-channel transistor 228 and a p-channel transistor 232, which are connected in series. The connection point between the n-channel transistor 228 and the p-channel transistor 232 is connected to the first node while the connection point between the n-channel transistor 220 and the p-channel transistor 224 is connected to the second node. The p-channel and n-channel transistors of the present disclosure can each be implemented as, for example, a metal-oxide-semiconductor field-effect transistor (MOSFET) or, as described below, a fin field-effect transistor (FinFET).

A p-channel transistor 234 is connected in series between the p-channel transistor 224 and a first reference potential 236, such as $V_{DD}$. A p-channel transistor 238 is connected in series between the p-channel transistor 232 and the first reference potential 236. Sources of the n-channel transistors 220 and 228 are connected to a second reference potential 240, such as $V_{SS}$ or ground. FIGS. 10A-10F provide an example of how the p-channel transistors 234 and 238 improve the write margin of the SRAM cell. In brief, if the second node is currently high, the p-channel transistor 224 attempts to keep the second node high even if the inverted bitline is attempting to pull the second node low during a write. In the SRAM cell of FIG. 3A, however, the bitline will be opposite to the inverted bitline, and therefore high, which turns off the p-channel transistor 234. This prevents the p-channel transistor 224 from pulling the second node high.

Similarly, if the first node is high, the p-channel transistor 232 will attempt to hold the first node high. If the bitline, during a write, attempts to pull the first node low, the bitline, through the pass gate 208, will be fighting against the p-channel transistor 232. Again, however, in the SRAM cell of FIG. 3A, the inverted bitline, which will be high, turns off the p-channel transistor 238, preventing the p-channel transistor 232 from sourcing any current that would keep the first node at a high voltage.

When the SRAM cell is not being read from or written to, the bitline and inverted bitline are driven low to turn on the p-channel transistor 234 and the p-channel transistor 238. This allows the p-channel transistor 232 or the p-channel transistor 224 to maintain the first node or the second node, respectively, at a high voltage, protecting against leakage.

In FIG. 3B, an alternative implementation of the modified SRAM cell according to the principles of the present disclosure is shown. Although reference numerals are reused for simplicity, various characteristics, such as width-to-length ratios, may be different because the configuration of FIG. 3B is different from the configuration of FIG. 3A. In FIG. 3B, the p-channel transistor 234, the p-channel transistor 224, and the n-channel transistor 220 are connected in series from the first reference potential 236 to the second reference potential 240, in that order. The p-channel transistor 238, the p-channel transistor 232, and the n-channel transistor 228 are connected in series from the first reference potential 236 to the second reference potential 240, in that order.

The pass gate 208 selectively connects the bitline to the first node, which is connected to the gates of the n-channel transistor 220 and the p-channel transistor 234. The pass gate 212 selectively connects the inverted bitline to the second node, which is connected to the gates of the n-channel transistor 228 and the p-channel transistor 238. The bitline is also connected to the gate of the p-channel transistor 234, while the inverted bitline is also connected to the gate of the p-channel transistor 232. The connection point between the p-channel transistor 232 and the n-channel transistor 228 is connected to the first node, and the connection point between the n-channel transistor 220 and the p-channel transistor 224 is connected to the second node.

When the first node is high, the p-channel transistor 238 would attempt to keep the first node high even when the bitline is driven low during a write cycle. At the same time, however, the inverted bitline is driven high, thereby turning off the p-channel transistor 232 and preventing the p-channel transistor 238 from maintaining the first node at a high level. Therefore, the pass gate 208 can, without competition, decrease the first node to a low voltage. When not reading or writing, the bitline and inverted bitline are driven low to turn on the p-channel transistor 224 and the p-channel transistor 232.

Figure 4A:
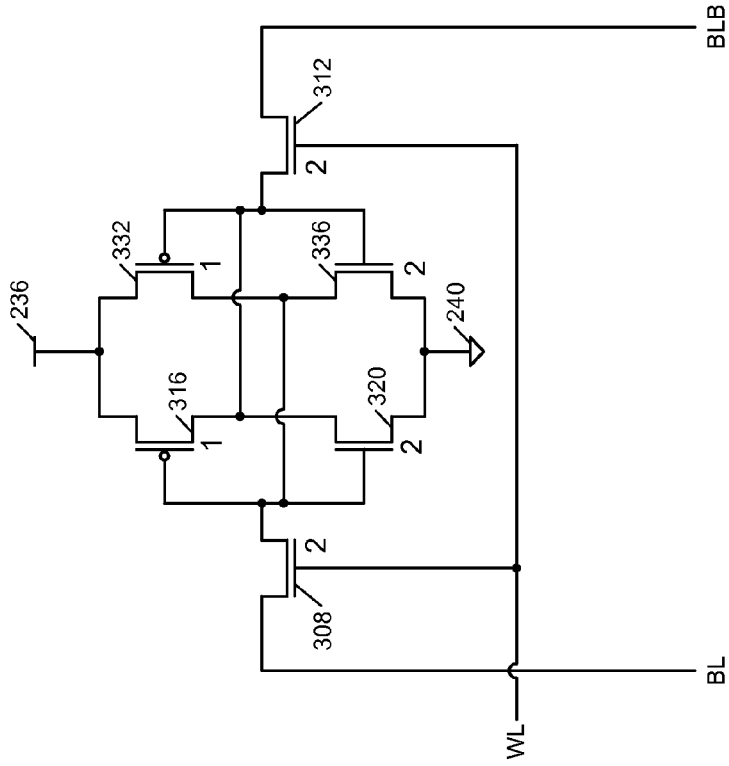
FIG. 4A is an example implementation of the SRAM cell of FIG. 1B using a FinFET process.

In FIG. 4A, the SRAM cell of FIG. 1B is adapted to a fin field-effect transistor (FinFET) process. A FinFET is a non-planar transistor whose source and drain are connected by one or more fins, around which the gate is arranged. Various new transistor technologies, including the FinFET, have two unique properties. The first property is that, for a given dimension, p-channel and n-channel devices are relatively similar in strength. The second property is that the granularity of dimensions that can be chosen is very coarse. For example, in FinFET technology, width and length may be fixed for a certain process and the dimensions of the transistor are set simply by the number of fins. As a result, the dimensions are only variable by an integer multiplier.

Returning to FIG. 4A, a pass gate 308, implemented as an n-channel transistor, selectively connects a bitline to a first node. A pass gate 312, implemented as an n-channel transistor, selectively connects an inverted bitline to a second node. The pass gates 308 and 312 are controlled by a wordline. The first node controls the gates of a p-channel transistor 316 and an n-channel transistor 320, which are connected in series between the first reference potential 236 and the second reference potential 240.

The second node is connected to gates of a p-channel transistor 332 and an n-channel transistor 336, which are connected in series between the first reference potential 236 and the second reference potential 240. The second node is connected to a point between the p-channel transistor 316 and the n-channel transistor 320, while the first node is connected to a point between the p-channel transistor 332 and the n-channel transistor 336. In FIGS. 4A-7B, the number of fins for each transistor is indicated by a single-digit integer printed adjacent to the transistor.

Each of the transistors in FIG. 4A has one fin. However, because the strengths of p-channel and n-channel transistors in a FinFET process are relatively similar, the pass gates 308 and 312 may not be strong enough to overcome the pull-up strength of the p-channel transistors 332 and 316. Therefore, in FIG. 4B, the number of fins for the pass gates 308 and 312 is each increased to 2. However, making the pass gates 308 and 312 twice as strong as the n-channel transistors 320 and 336 may hamper read stability. Read stability is a measure of how unlikely it is for the value of the SRAM cell to be unintentionally altered during a read operation. The n-channel transistors 320 and 336 are also strengthened to 2 fins to improve read stability.

Figure 4B:
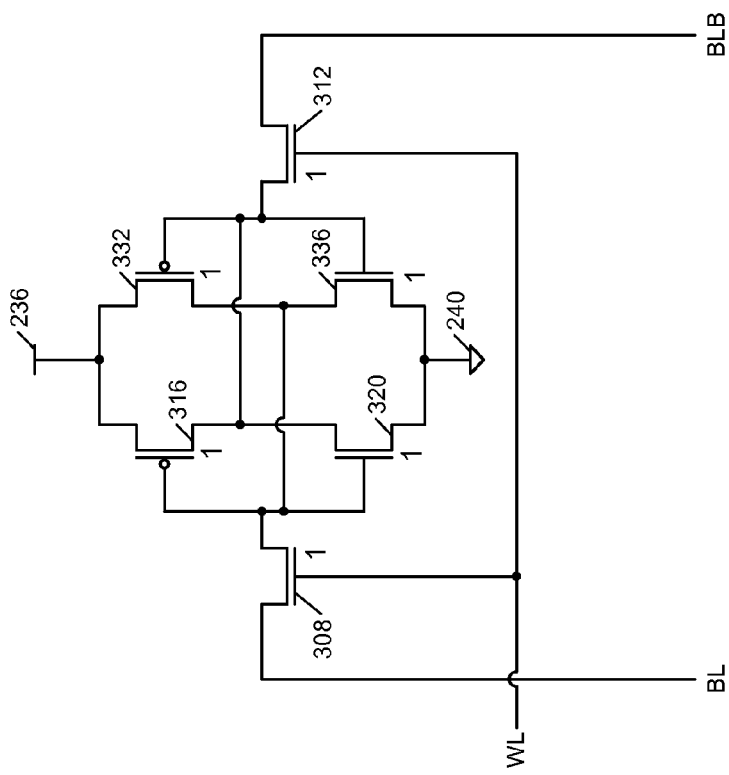
FIG. 4B is a modification of the SRAM cell of FIG. 4A to improve write margin.
Figure 5B:
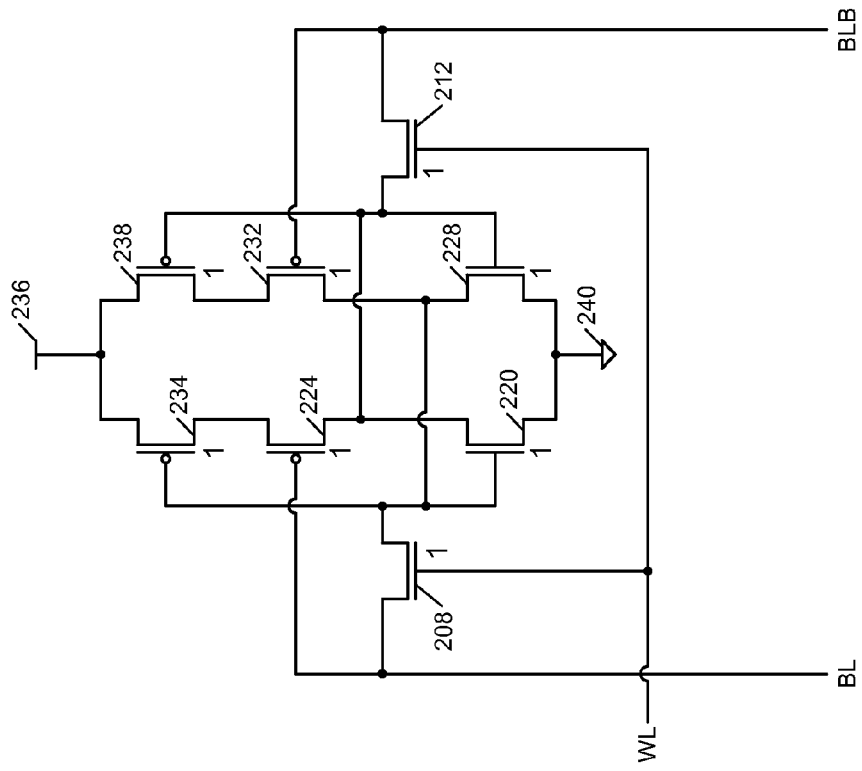
FIGS. 5A and 5B are example implementations of the modified SRAM cells of FIGS. 3A and 3B, respectively, in a FinFET process.
Figure 5A:
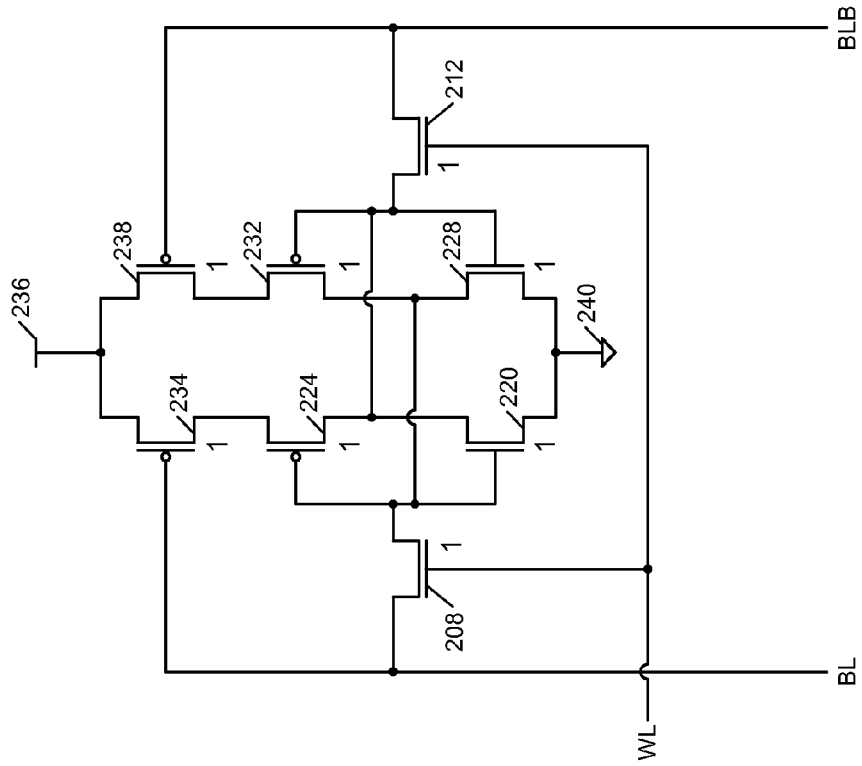

In FIG. 5A, an implementation of the SRAM cell of FIG. 3A in a FinFET process is shown where the number of fins for each of the transistors is 1. Because the p-channel transistors 234 and 238 prevent the p-channel transistors 224 and 232, respectively, from fighting against the pass gates 208 and 212, the pass gates 208 and 212 do not need to be increased in strength relative to the p-channel transistors 224 and 232. In FIG. 5A, the total number of fins for the SRAM cell is therefore 8. By comparison, the total number of fins in the SRAM cell of FIG. 4B is 10. The number of fins may roughly correspond to area, and therefore the area of the SRAM cell of FIG. 5A may be less than that of FIG. 4B even though FIG. 4B has fewer transistors. In FIG. 5B, a FinFET implementation of FIG. 3B can also be designed using one fin for each transistor.

Figure 6:
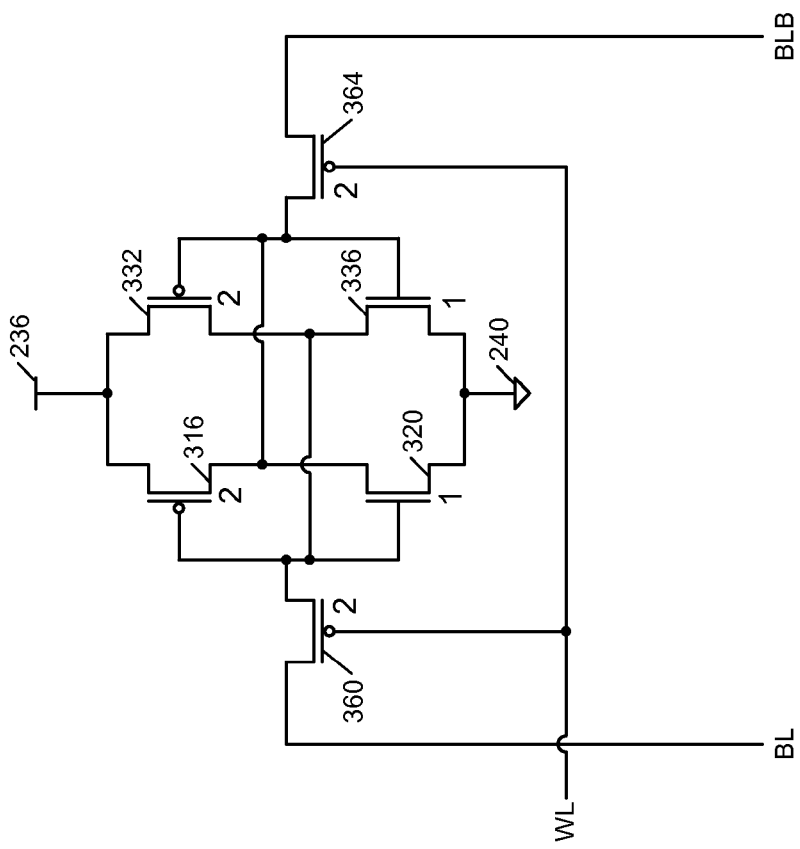
FIG. 6 is an alternative implementation of FIG. 4B using p-channel pass gates.

In FIG. 6, a modification is made to the SRAM cell of FIG. 4B. Because p-channel transistors in a FinFET process are relatively equal in strength to n-channel transistors, pass gates of an SRAM cell may be implemented using p-channel transistors instead of n-channel transistors. A pass gate 360 is implemented as a p-channel transistor and selectively connects the first node to the bitline. A pass gate 364 is implemented as a p-channel transistor and selectively connects the inverted bitline to the second node. The pass gates 360 and 364 are controlled by the wordline. However, in contrast to FIG. 4B, the wordline in FIG. 6 will be active-low; in other words, a low voltage will enable the pass gates 208 and 212.

Figure 7B:
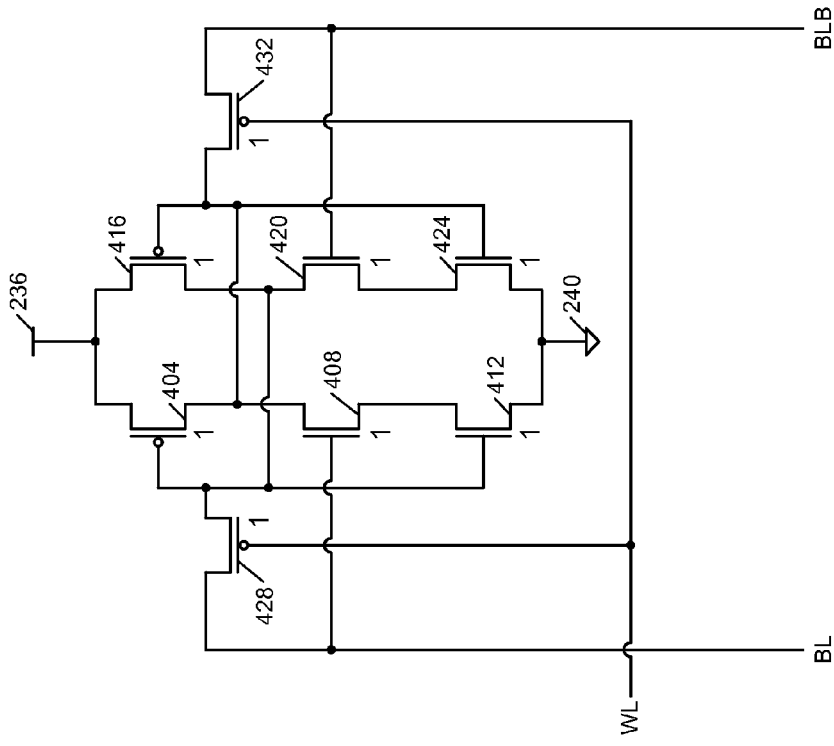
FIGS. 7A and 7B are alternative implementations of FIGS. 5A and 5B using p-channel pass gates.
Figure 7A:
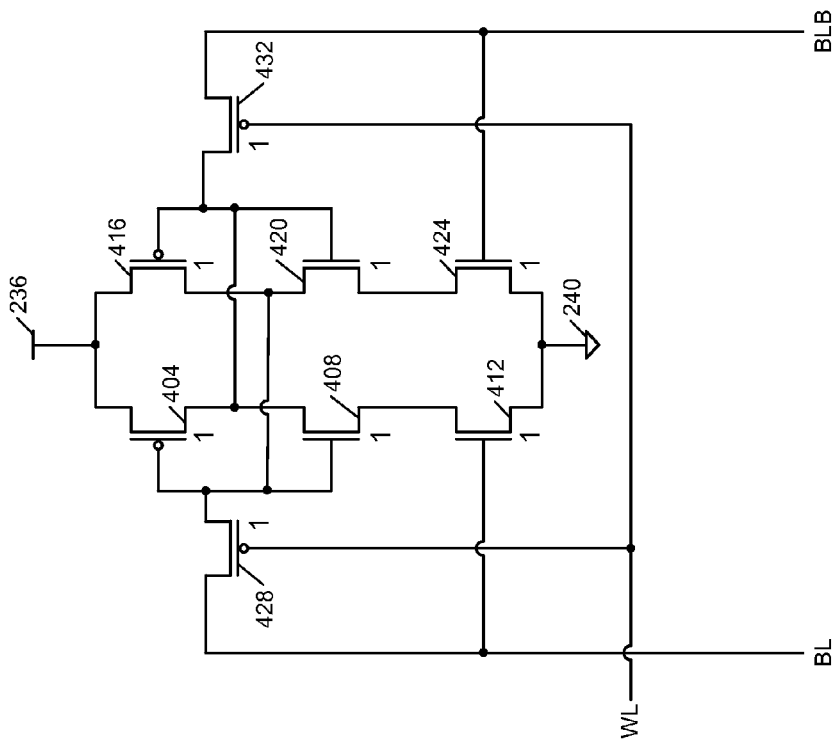

FIG. 7A shows an alternative implementation of an SRAM cell using the principles of the present disclosure. A p-channel transistor 404, an n-channel transistor 408, and an n-channel transistor 412 are connected in series from the first reference potential 236 to the second reference potential 240, in that order. A p-channel transistor 416, an n-channel transistor 420, and an n-channel transistor 424 are connected in series from the first reference potential 236 to the second reference potential 240, in that order.

A pass gate 428, implemented as a p-channel transistor, selectively connects a bitline to a first node. The first node is connected to the gates of the p-channel transistor 404 and the n-channel transistor 408, as well as to the connection point between the p-channel transistor 416 and the n-channel transistor 420. A pass gate 432, implemented as a p-channel transistor, selectively connects an inverted bitline to a second node, which is connected to the gates of the p-channel transistor 416 and the n-channel transistor 420, as well as to the connection point between the p-channel transistor 404 and the n-channel transistor 408. The bitline is also connected to a gate of the n-channel transistor 412, while the inverted bitline is connected to the gate of the n-channel transistor 424.

Because the gates of p-channel transistors are often biased below their source terminals, p-channel transistors may be more susceptible than n-channel transistors to a phenomenon known as negative-bias temperature instability. Over time, negative-bias temperature instability increases the threshold voltage of the p-channel transistor. By using p-channel transistors as the pass gates 428 and 432, the negative-bias temperature instability of the p-channel transistors 404 and 416 may be offset to some extent by the negative-bias temperature instability that is also affecting the pass gates 428 and 432. This may allow the SRAM cells of FIGS. 7A and 7B to continue working reliably for longer than the SRAM cells of FIGS. 3A and 3B.

In FIG. 7B, reference numerals from FIG. 7A are used for simplicity, but the physical layout and/or dimensions of the transistors may vary from those of FIG. 7A. In FIG. 7B, the p-channel transistor 404, the n-channel transistor 408, and the n-channel transistor 412 are connected in series from the first reference potential 236 to the second reference potential 240, in that order. In addition, the p-channel transistor 416, the n-channel transistor 420, and the n-channel transistor 424 are connected in series from the first reference potential 236 to the second reference potential 240, in that order.

The first node is connected to the gates of the p-channel transistor 404 and the n-channel transistor 412, as well as to the connection point between the p-channel transistor 416 and the n-channel transistor 420. The second node is connected to the gates of the p-channel transistor 416 and the n-channel transistor 424, as well as to the connection point between the p-channel transistor 404 and the n-channel transistor 408. The bitline is connected to the gate of the n-channel transistor 408, while the inverted bitline is connected to the gate of the n-channel transistor 420.

Figure 8:
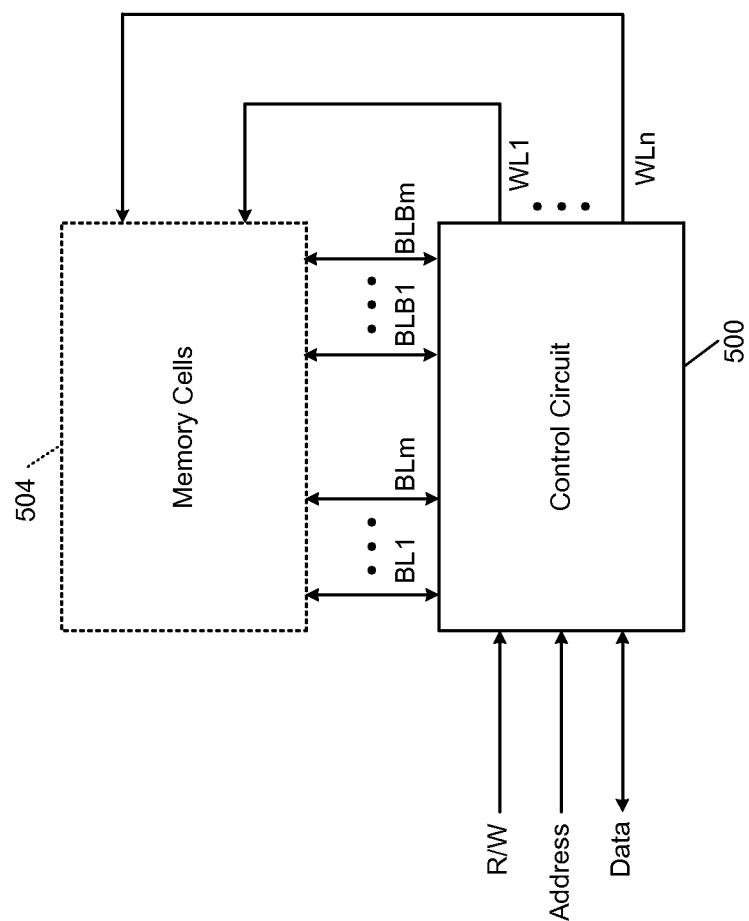
FIG. 8 is a functional block diagram of a memory system.

In FIG. 8, a memory system includes a control circuit 500 that is configured to generate wordline signals (WL1-WLn) to control a matrix of memory cells 504, such as a matrix of multiple copies of one or more of the SRAM cells described above. The control circuit 500 also generates bitline signals (BL1-BLm) and inverted bitline signals (BLB1-BLBm) to write data to the memory cells 504. In addition, the control circuit 500 reads data from the memory cells 504 using the bitline and inverted bitline signals. The control circuit 500 receives instructions regarding reads and writes, such as by a single bit indicating either a read or a write. The control circuit 500 also receives an address from which the read should occur or to which the write should be performed. The control circuit 500 receives data to be written and transmits data that has been read.

When wordline drivers in the control circuit 500 attempt to drive long strings of SRAM cells, the speed at which the wordline signals can drive corresponding pass gates diminishes for cells that are further away from the wordline drivers. As a result, the number of cells that can be placed on a given wordline is limited. To extend the number of cells that can be located on a single wordline, buffers may be used to amplify the wordline signal for more distant cells.

In FIG. 9A, for example, a first set of cells 520 may receive the wordline signals, while a second set of cells 524 receive wordline signals that are passed through a pair of inverters 528 (inverters 528-1 . . . 528-n corresponding to wordlines WL1-WLn) and 532 (inverters 532-1 . . . 532-n corresponding to wordlines WL1-WLn). The pair of inverters 528 and 532 strengthens, without altering, the signals on the wordlines.

In FIG. 9B, by contrast, the second set of cells 524 from FIG. 9A is replaced with cells 540 that respond to the wordline signals oppositely in comparison to the first set of cells 520. For example, as shown above, the cells 540 may be implemented using p-channel transistors as pass gates compared to n-channel transistors as pass gates for the cells 520. Because the p-channel transistors are active low and the n-channel transistors are active high, only the first inverters 528 are used, decreasing delay and area cost associated with the second inverters 532. If the wordlines are longer and require yet another set of cells, another single inverter may be included and the next set of cells can use n-channel transistors as pass gates. Additional discussion of wordline repeaters and drivers is found in commonly-owned U.S. patent application Ser. No. 14/066,796, filed on Oct. 30, 2013, titled "Concurrent Use Of SRAM Cells With Both NMOS And PMOS Pass Gates In A Memory System," the entire disclosure of which is incorporated by reference herein.

Figure 10A:
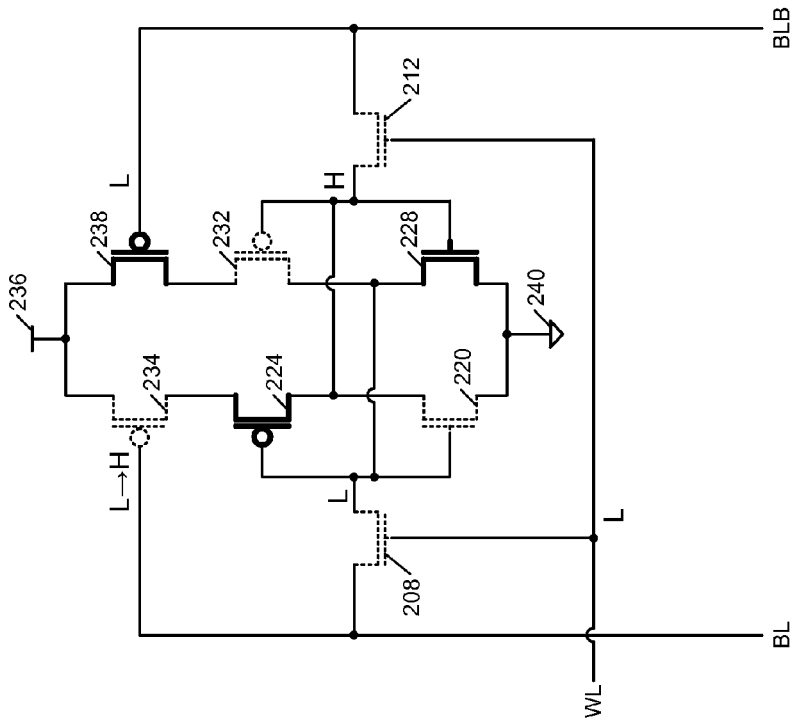
FIGS. 10A-10F are graphical depictions of writing a new value to the SRAM cell of FIG. 3A.

In FIG. 10A, the first node is at a low voltage while the second node is at a high voltage. As a result of these values, the p-channel transistor 224 and the n-channel transistor 228 are on, while the n-channel transistor 220 and the p-channel transistor 232 are off. As long as the notation remains consistent, this could be referred to as either a digital zero or a digital one, and for this disclosure will be referred to as a digital zero. To allow the SRAM cells to maintain their values, the bitline and inverted bitline signals are driven low to turn on the p-channel transistor 234 and the p-channel transistor 238 for each cell controlled by the bitline and the inverted bitline signals.

Figure 10B:
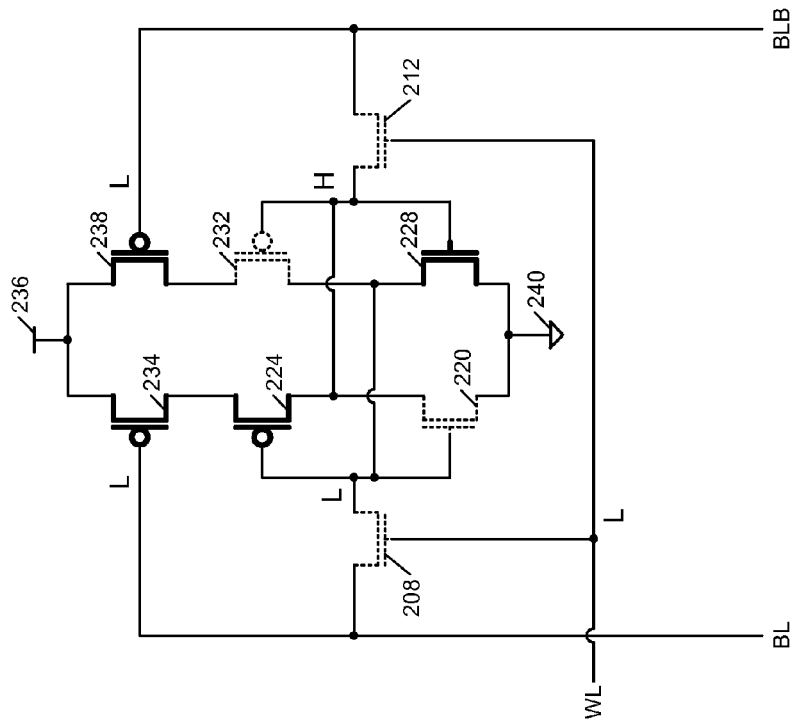

In FIG. 10B, the bitline signal is driven high in preparation for writing a new value (digital one) to the SRAM cell, while the inverted bitline remains low. The new value will establish the first node at a high value and the second node at a low value. Driving the bitline high turns off the p-channel transistor 234.

Figure 10D:
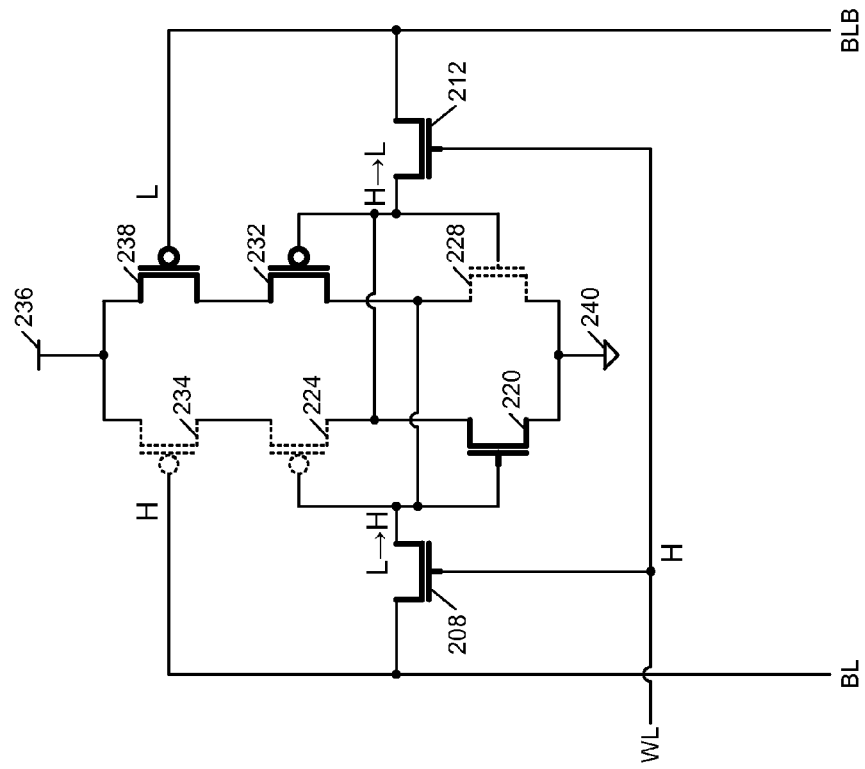
Figure 10C:
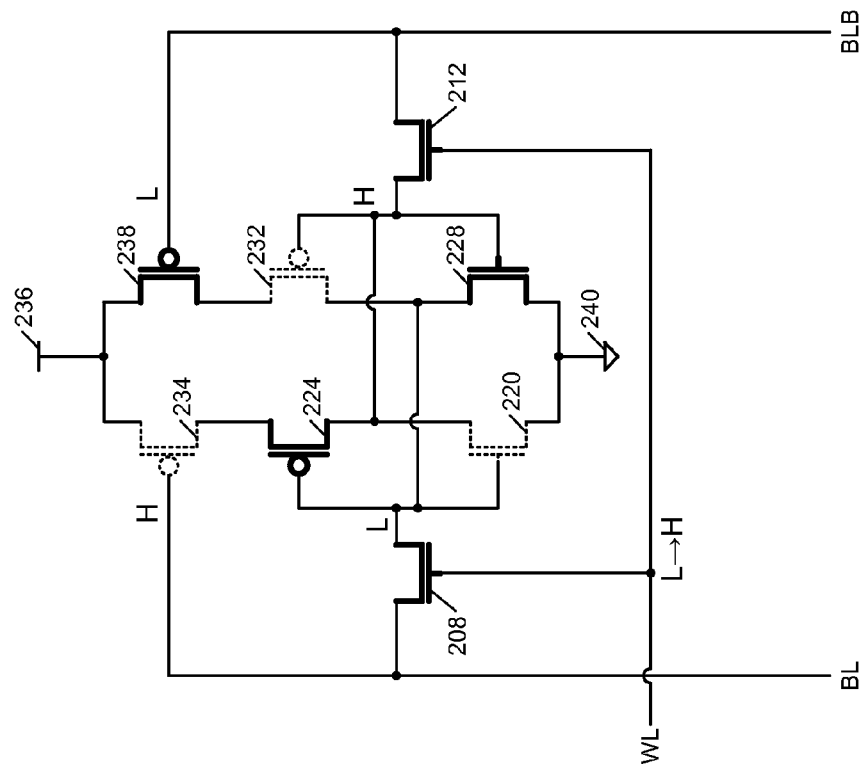

In FIG. 10C, the wordline is driven high to turn on the pass gates 208 and 212. The pass gate 208 therefore attempts to pull the first node up to the high value driven by the bitline, while the pass gate 212 attempts to pull the second node down to the low value driven by the inverted bitline. The p-channel transistor 224 is on, and would therefore attempt to hold the second node at a high value. However, because the p-channel transistor 234 is turned off, the p-channel transistor 224 cannot source any current, and therefore the pass gate 212 can pull the second node low without opposition from the p-channel transistor 224.

In FIG. 10D, the second node is shown transitioning from high to low, and the first node is shown transitioning from low to high. This turns on the p-channel transistor 232 and the n-channel transistor 220, and turns off the p-channel transistor 224 and the n-channel transistor 228.

Figure 10F:
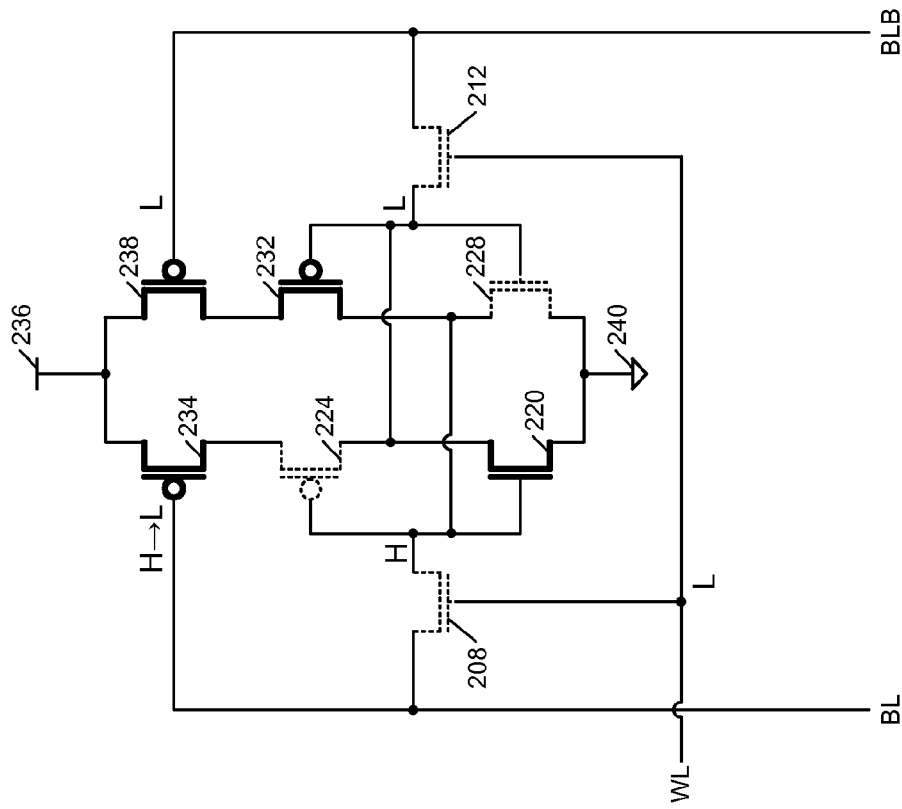
Figure 10E:
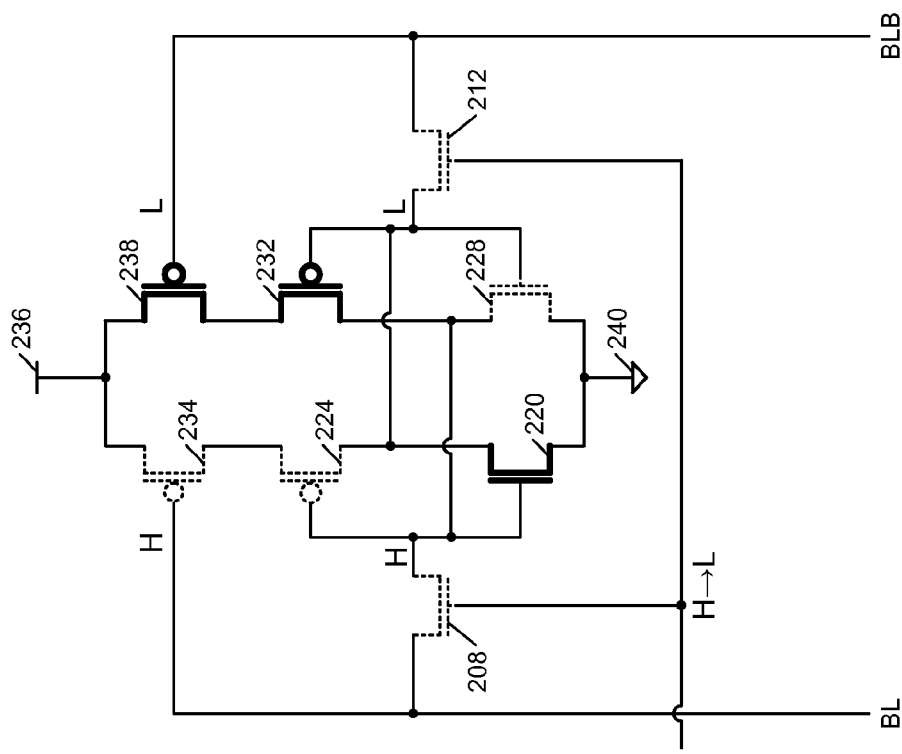

In FIG. 10E, the wordline is then de-asserted (transitioning from high to low), which turns off the pass gate 208 and the pass gate 212.

In FIG. 10F, the bitline and the inverted bitline are then driven low to turn on the p-channel transistors 234 and 238, which allow the SRAM cells to maintain their values against parasitic leakage currents.

Figure 11A:
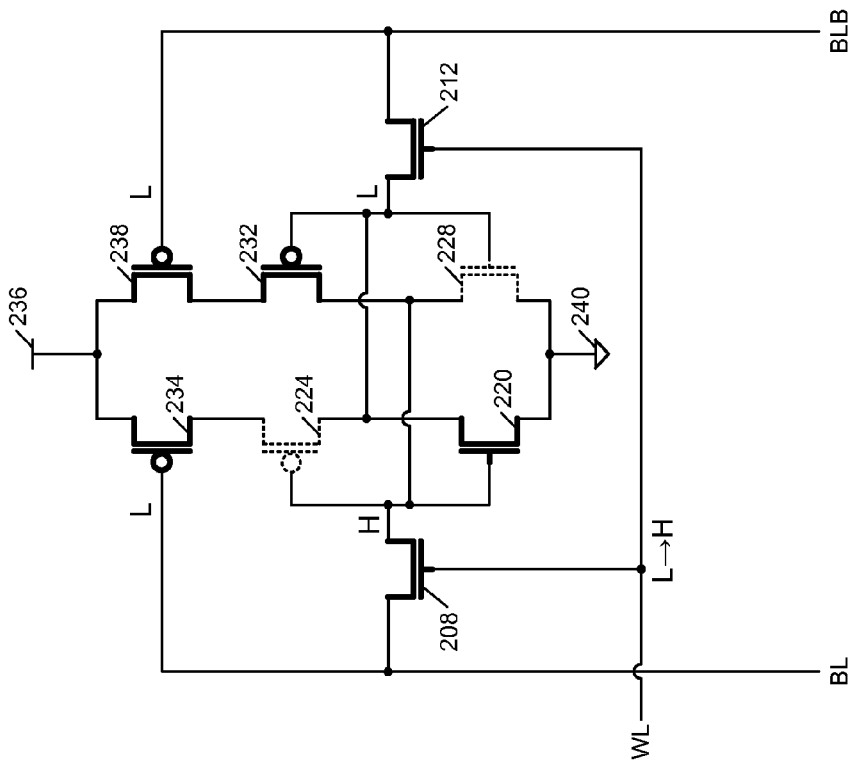
FIGS. 11A-11D are graphical depictions of reading a value from the SRAM cell of FIG. 3A.

FIG. 11A begins a depiction of a read cycle of an example SRAM cell. The first node is high and the second node is low, such as would be the case upon conclusion of the writing process shown in FIGS. 10A-10F.

Figure 11B:
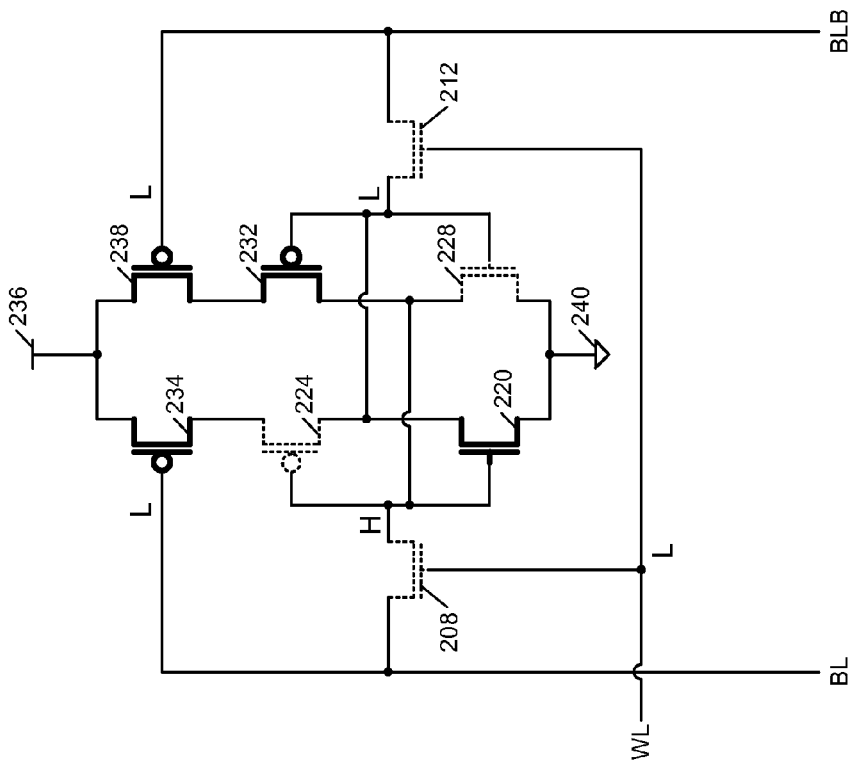

In FIG. 11B, after being charged low, the bitline and the inverted bitline are floated. That is, no value is driven on to the bitline and the inverted bitline. This may be accomplished, if bitline drivers are implemented as tristate buffers, by placing the buffers in a high-impedance state. The wordline is then asserted, turning on the pass gates 208 and 212. For an accurate reading, the high value of the first node must pull up the bitline toward a high value. The current required for this pull-up can be provided by the capacitance at the first node, as well as by the p-channel transistors 232 and 238.

Figure 11D:
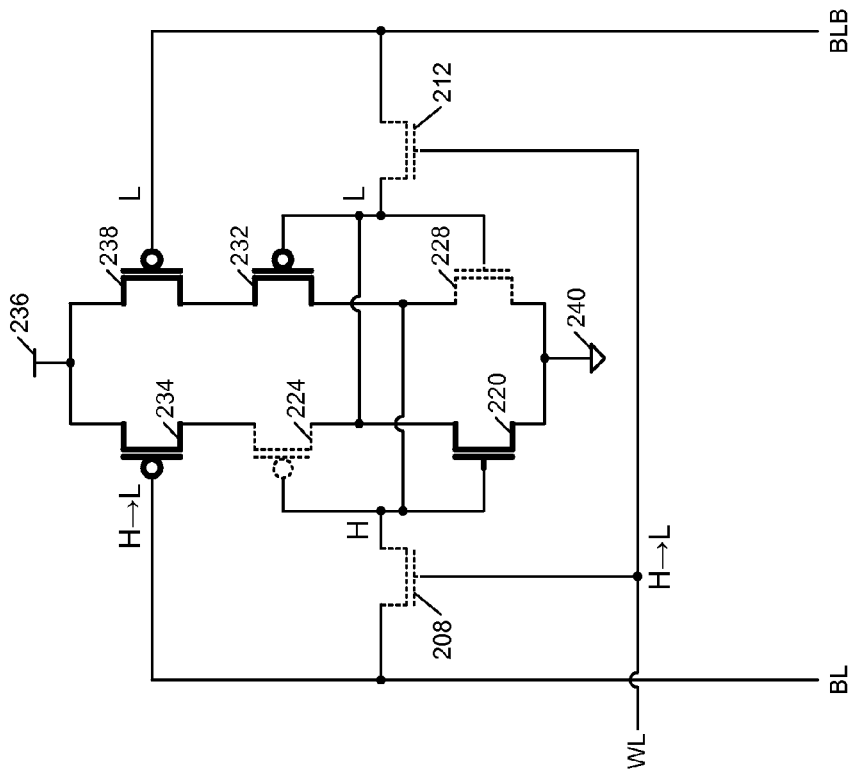
Figure 11C:
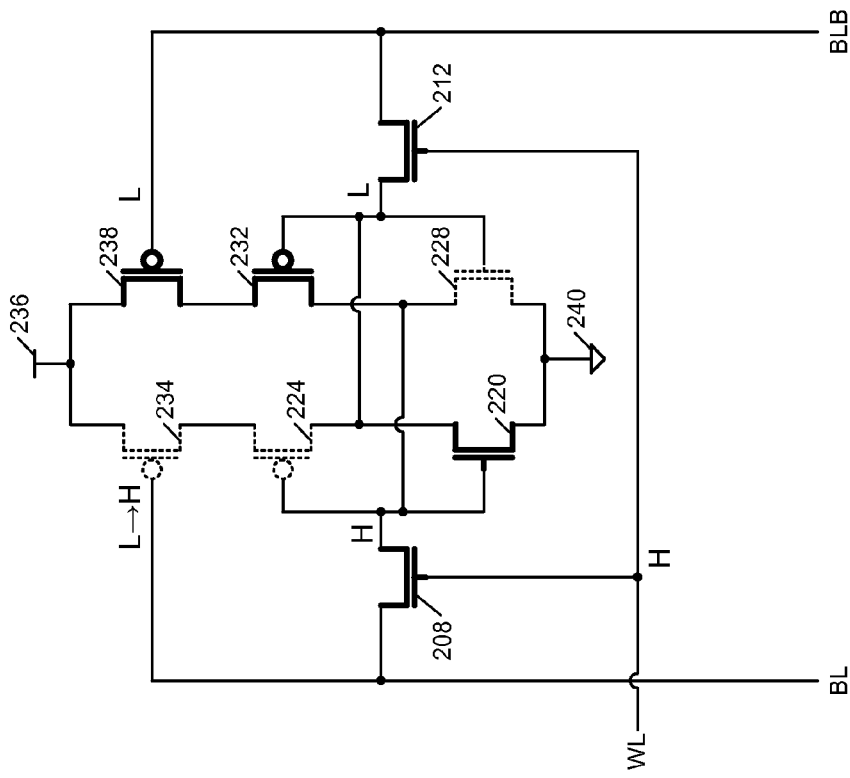

In FIG. 11C, the bitline is shown being pulled high by the p-channel transistors 232 and 238. Although the voltage of the bitline may be limited short of a fully-high voltage by the threshold voltage of the pass gate 208, this high voltage may turn off the p-channel transistor 234. In either case, this may create little impact on the circuit operation because the p-channel transistor 224 is already off due to the high value at its gate.

The values of the bitline and inverted bitline are read to infer the value stored by the SRAM cell. In various implementations, a value based on a differential between the bitline and the inverted bitline may be amplified to determine whether the SRAM cell was storing a digital zero or digital one. In practical implementations, the bitline and the inverted bitline may not be driven fully to a low or high value, but simply far enough apart so that the difference will indicate the value stored by the SRAM cell.

In FIG. 11D, the wordline is de-asserted, turning off the pass gates 208 and 212. In addition, the bitline and inverted bitline are both driven low to turn on the p-channel transistors 234 and 238. In various implementations, (i) driving the bitline and the inverted bitline low and (ii) de-asserting the wordline may be performed in either order or simultaneously.

In actual physical implementations of the SRAM cell, various non-idealities may be present, such as mismatched threshold voltages. When a significant threshold voltage mismatch is present, such as between the p-channel transistors 224 and 232, or between the n-channel transistors of the pass gates 208 and 212, the SRAM cell may be corrupted (i.e., switched to the other bi-stable state) when the bitline and the inverted bitline are charged low and the wordline is asserted.

A new method of reading to reduce the risk of corruption or improve read stability is shown below in FIG. 13B. This method controls the wordline in such a way as to turn the wordline ON and OFF multiple times during a single read operation. Given that corruption is caused by interaction of the charge on the bitline and the inverted bitline and the first and second nodes of the SRAM cell, and given that the switching of the SRAM cell from its original state to a new corrupted state takes a certain amount of time—tens or hundreds of picoseconds (ps), for example—shortening the ON time of the wordline will help prevent corruption from occurring.

Figure 2B:
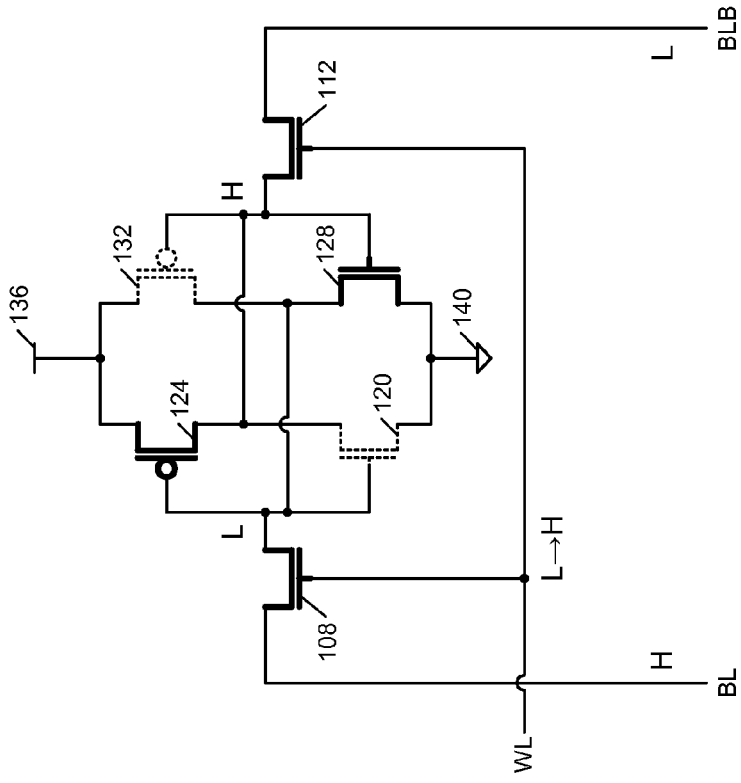
FIGS. 2A-2D are graphical depictions of a writing process for the SRAM cell of FIG. 1B.
Figure 2A:
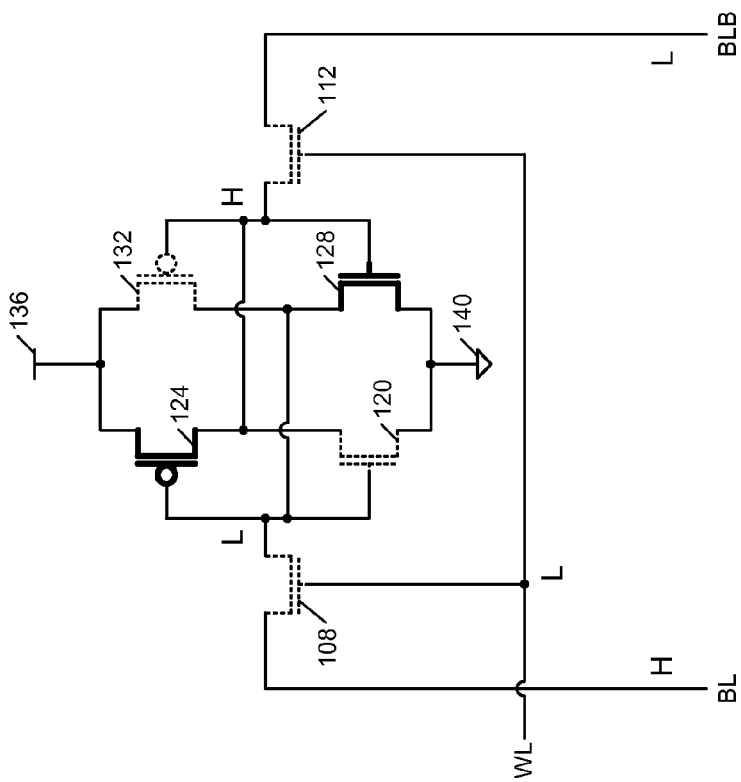
Figure 2C:
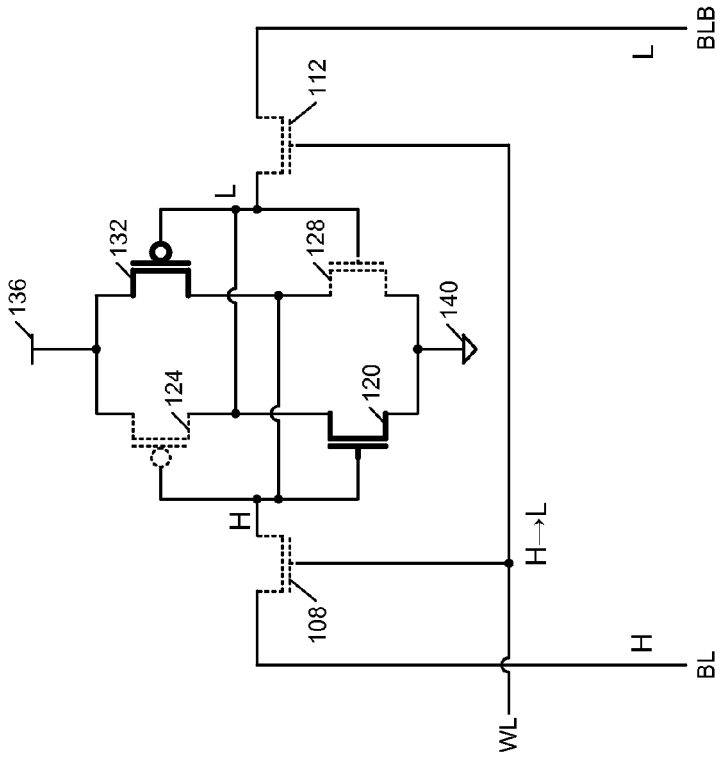
Figure 2D:
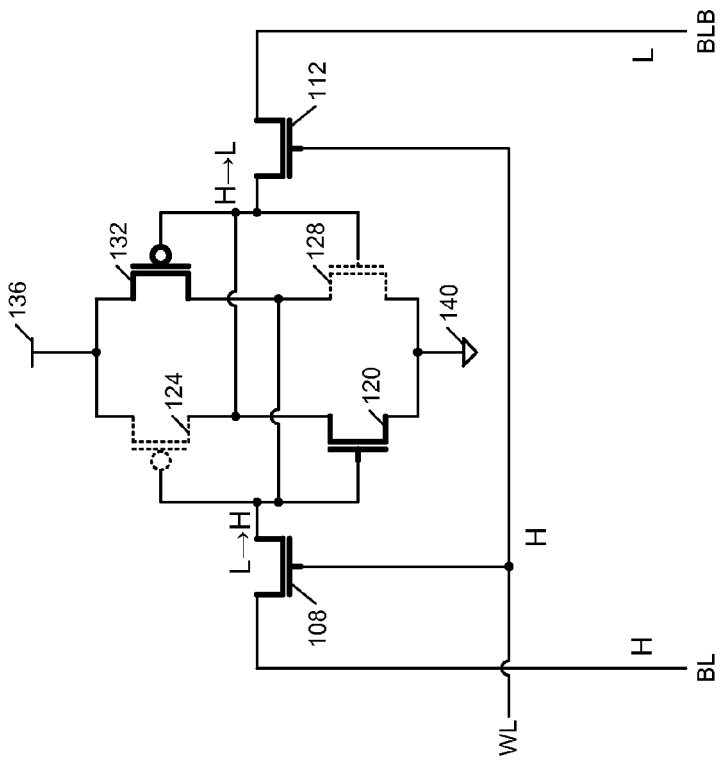

However, because the bitline and the inverted bitline require enough voltage separation from each other for a proper reading, multiple cycles of a wordline ON pulse (each being a short, safe duration) may be generated. For example only, if a wordline pulse previously required a 500 ps duration for proper separation of the bitline and the inverted bitline, then 5 separate wordline pulses having a duration of 100 ps each may be used instead. The duration between the wordline pulses should be long enough for the first and second nodes of SRAM cell to return to their original stable voltages by operation of the cross-coupled inverters. This new method is not limited to the cell shown in FIG. 5A, but can be used with traditional SRAM cells such as that of FIG. 2A or variants using p-channel pass gates, regardless of whether the transistors are implemented as FinFETs or not.

Figure 12B:
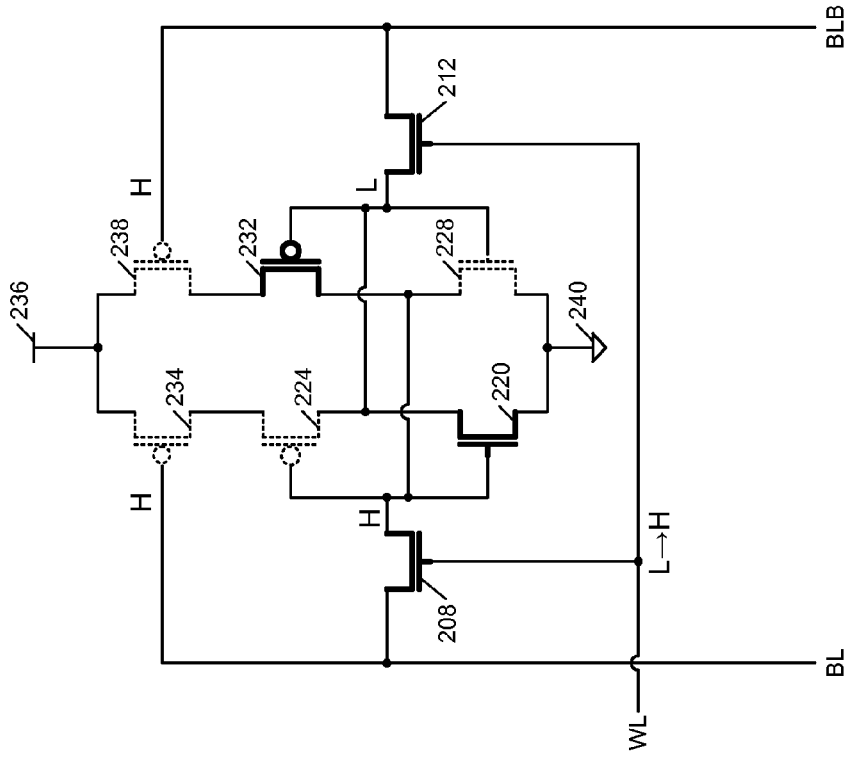
FIGS. 12A-12D are graphical depictions of an alternate approach to reading a value from the SRAM cell of FIG. 3A.
Figure 12A:

FIGS. 12A-12D depict an alternative method of reading an example SRAM cell. In FIG. 12A, the bitline and the inverted bitline are precharged high to disable the p-channel transistors 234 and 238. Although this may increase the power budget of the SRAM cell in comparison to the approach of FIGS. 11A-11D, the resulting read stability may be higher.

In FIG. 12B, the wordline is asserted, turning on the pass gates 208 and 212, and connecting the low voltage of the second node to the inverted bitline, which had been precharged high.

Figure 12D:
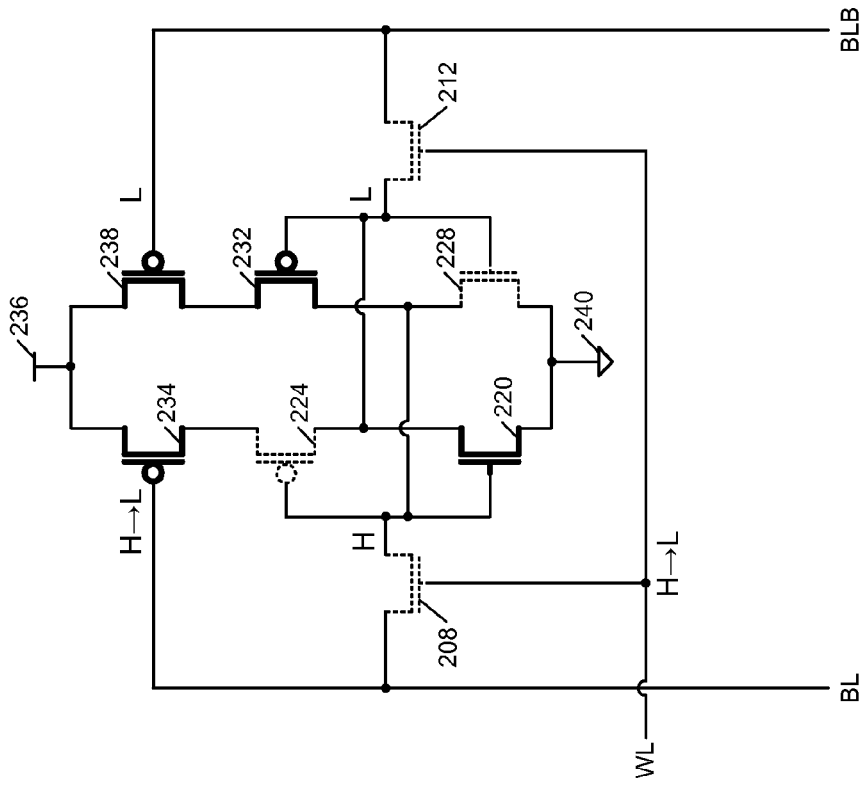
Figure 12C:
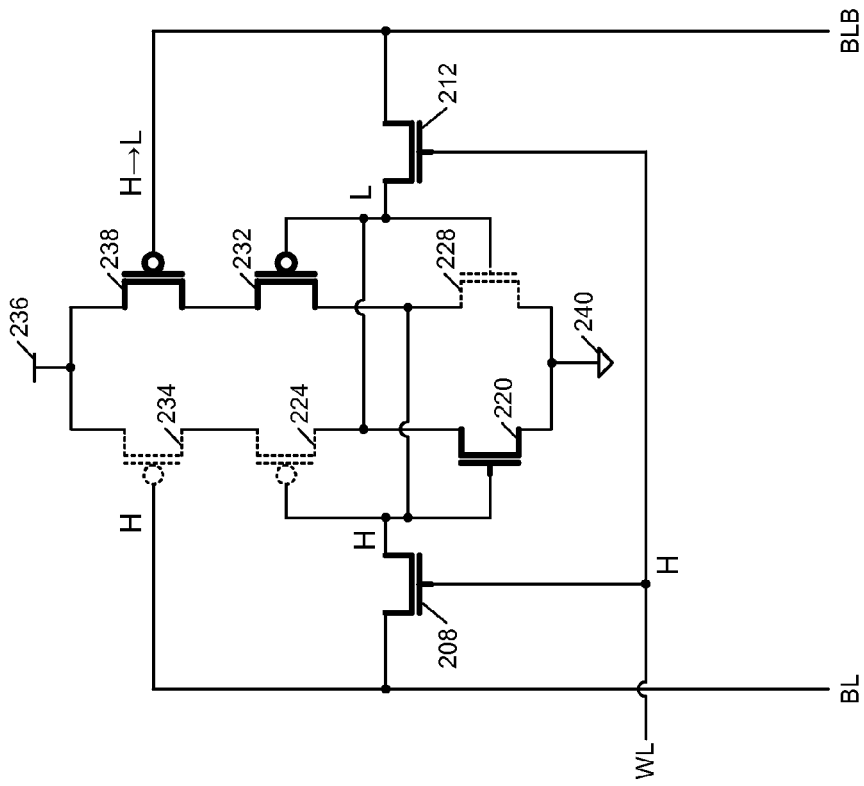

In FIG. 12C, the n-channel transistor 220 pulls down the inverted bitline through the pass gate 212. The inverted bitline may not reach a fully-low voltage but instead only reach an intermediate voltage approximately equal to the fully-low voltage plus a threshold voltage of the pass gate 212. This intermediate voltage may be enough to turn on the p-channel transistor 238, which would then help to hold the first node high. The difference between the bitline and the inverted bitline is then measured to determine whether the SRAM cell had been storing a digital one or a digital zero.

In FIG. 12D, the wordline is de-asserted and the bitline and the inverted bitline are driven low to keep the p-channel transistors 234 and 238 on, thereby maintaining the value stored by the SRAM cell.

Figure 13A:
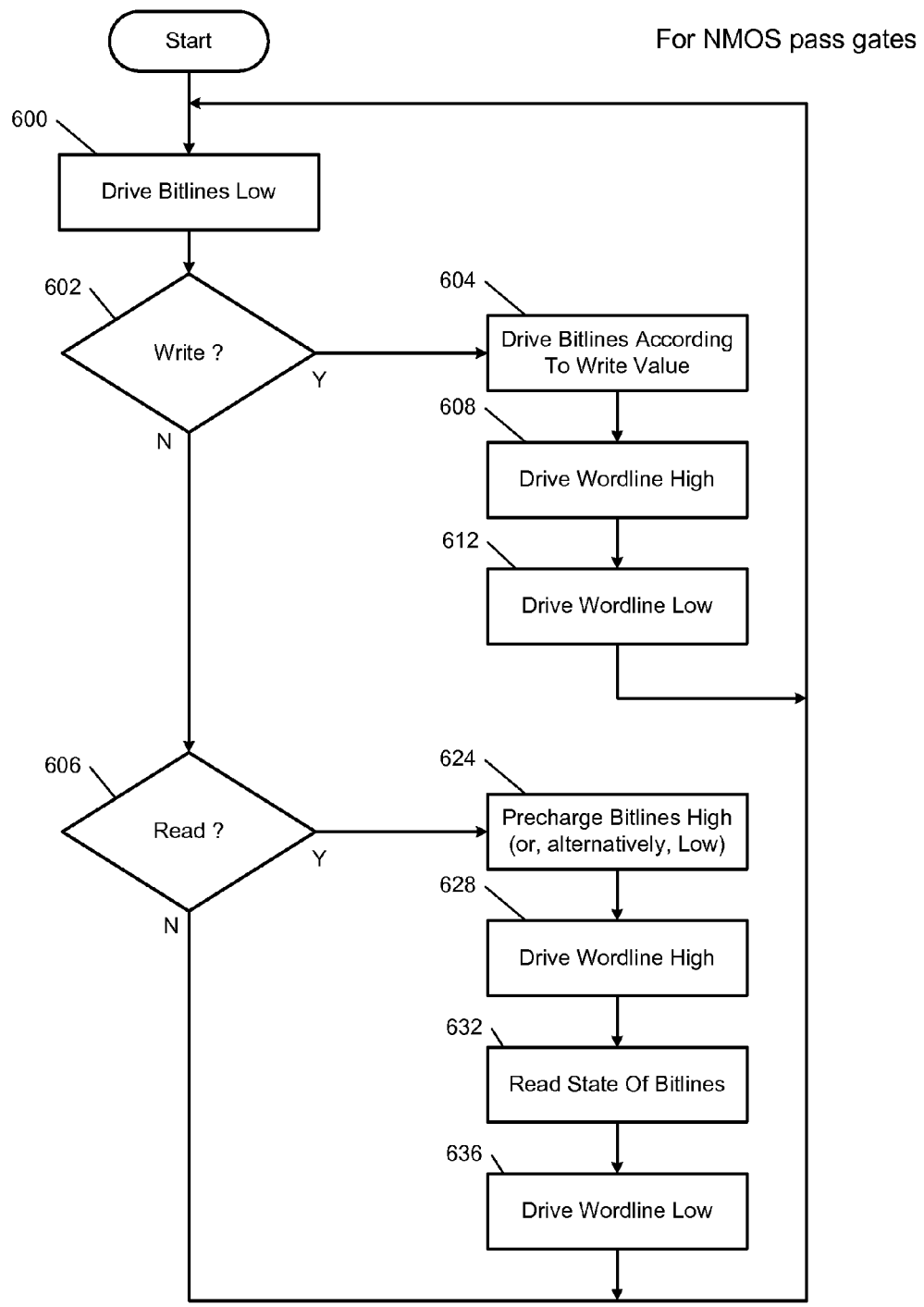
FIGS. 13A-13B are flowcharts for controlling a memory system, such as the memory system of FIG. 8.

In FIG. 13A, example actions performed by the control circuit 500 are shown for the case of n-channel pass gates. To apply these actions to p-channel pass gates, references to low values can be replaced with high values, and references to high values can be replaced with low values. Control may start when power is supplied to the control circuit 500. Control starts at 600, where bitlines (including bitlines and inverted bitlines) are driven low to maintain values within SRAM cells. Driving the bitlines low turns on enable transistors, such as the p-channel transistors 234 and 238 of FIG. 5A, so that the cross-coupled inverters within each SRAM cell are active and can maintain the state of the SRAM cell. If the enable transistors were n-channel transistors, a high voltage would enable the enable transistors, and therefore the bitlines would instead be driven high in such implementations.

At 602, if a write has been requested, control transfers to 604; otherwise, control transfers to 606. At 604, bitlines are driven according to received data corresponding to a selected wordline. Control continues at 608, where the selected wordline is driven high to store the values indicated by the bitlines into the SRAM cells along the selected wordline. Control continues at 612, where the wordline is then driven low to conclude the write process. Control then returns to 600.

At 606, if a read has been requested, control transfers to 624; otherwise, control returns to 600. At 624, control precharges bitlines to a high value and then floats the bitlines. Alternatively, as described in FIGS. 11A-11D, control may instead leave the values on the bitlines low before floating the bitlines. Control continues at 628, where the wordline is driven high to read the value of the cells onto the bitlines. Control continues at 632, where the states of the bitlines are read to indicate the states of the SRAM cells. At 636, the wordline is driven low to disconnect the cells from the bitlines. Control then returns to 600.

Figure 13B:
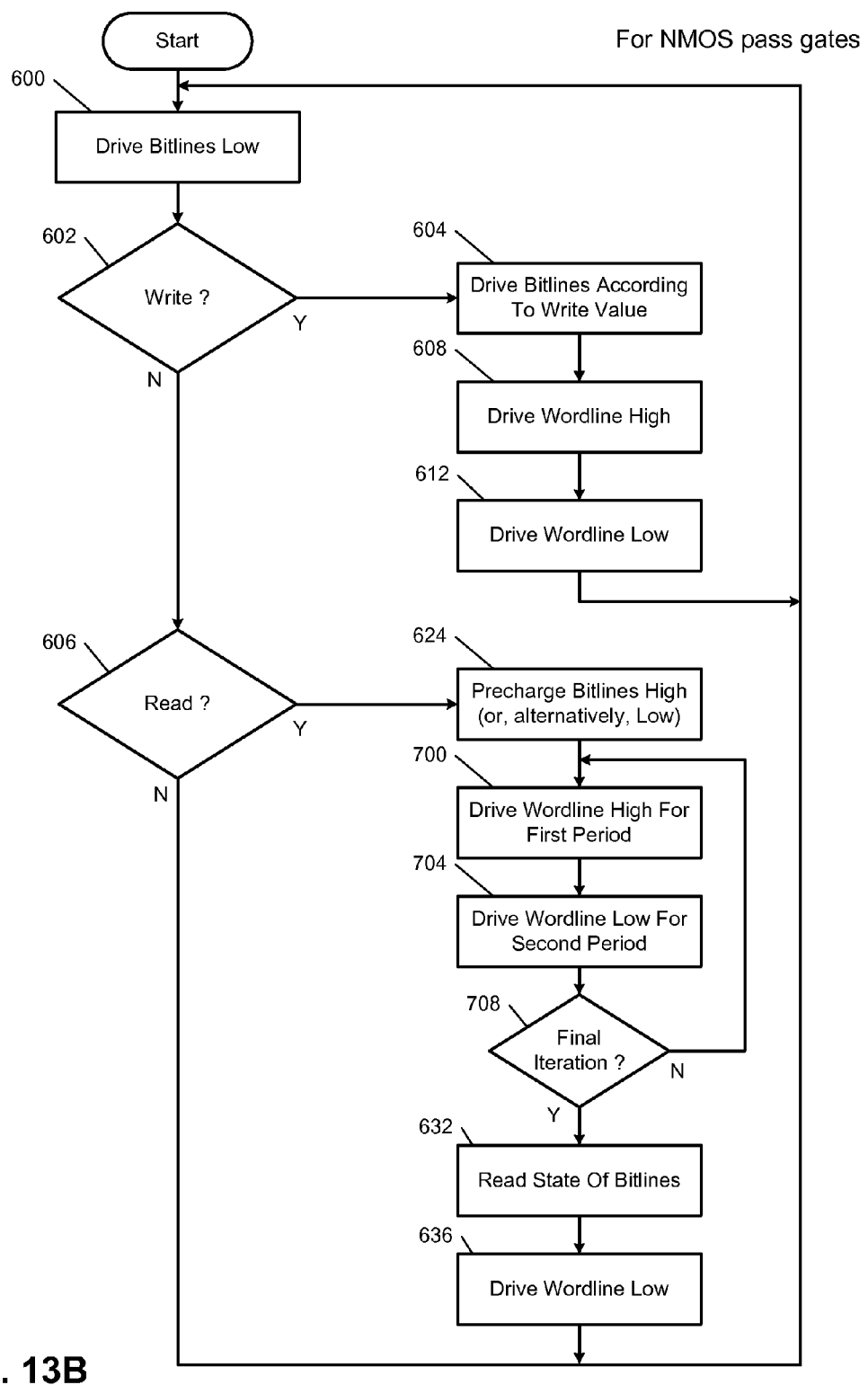

In FIG. 13B, the write procedure is unchanged. However, in response to a read request at 606, the bitlines are precharged high (or, as discussed above as an alternative, low) and then floated. Control continues at 700, wherein the wordline is driven high (i.e., asserted because this example uses n-channel pass gates, which are active-high) for a first predetermined period of time. Control continues at 704, where the wordline is driven low (i.e., de-asserted) for a second predetermined period of time.

The alternating assertion and de-assertion of the wordline is repeated for a predetermined number of iterations. At 708, control determines whether the final iteration has been performed. If so, control continues at 632. Otherwise, control returns to 700 to perform another iteration of assertion and de-assertion of the wordline.

In various implementations, a first predetermined number of iterations may be performed, followed by the state of the cell being read based on a voltage difference between the bitlines at 632. However, if the voltage difference is insufficient, control may return to 700 and perform a second predetermined number of iterations that is greater than the first predetermined number of iterations. To improve stability (i.e., make an inadvertent change in the state of the SRAM cell less likely), a predetermined delay may be instituted before returning to 700. This may ensure that the cross-coupled inverters drive each other's inputs back to stable voltages before another read is attempted.

As discussed above, reading of the cell using multiple wordline pulses is applicable to cells according to the present disclosure, such as are depicted in FIG. 5A, as well as to prior art cells. For some prior art cells, driving the bitlines low at 600 may be omitted as unnecessary because the simplified structure of prior art SRAM cells does not include enable transistors.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A or B or C), using a non-exclusive logical OR. It should be understood that one or more steps within a method may be executed in different order (or concurrently) without altering the principles of the present disclosure.

The term circuit may refer to, be part of, or include an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor (shared, dedicated, or group) that executes code; memory (shared, dedicated, or group) that stores code executed by a processor; other suitable hardware components that provide the described functionality; or a combination of some or all of the above, such as in a system-on-chip.

The term code, as used above, may include software, firmware, and/or microcode, and may refer to programs, routines, functions, classes, and/or objects. The term shared processor encompasses a single processor that executes some or all code from multiple circuits. The term group processor encompasses a processor that, in combination with additional processors, executes some or all code from one or more circuits. The term shared memory encompasses a single memory that stores some or all code from multiple circuits. The term group memory encompasses a memory that, in combination with additional memories, stores some or all code from one or more circuits. The term memory may be a subset of the term computer-readable medium. The term computer-readable medium does not encompass transitory electrical and electromagnetic signals propagating through a medium, and may therefore be considered tangible and non-transitory. Non-limiting examples of a non-transitory tangible computer readable medium include nonvolatile memory, volatile memory, magnetic storage, and optical storage.

The apparatuses and methods described in this application may be partially or fully implemented by one or more computer programs executed by one or more processors. The computer programs include processor-executable instructions that are stored on at least one non-transitory tangible computer readable medium. The computer programs may also include and/or rely on stored data.

What is claimed is:

1. A static random access memory (SRAM) cell comprising:
   a first n-channel field-effect transistor ("n-channel transistor");
   a second n-channel transistor;
   a first p-channel field-effect transistor ("p-channel transistor");
   a second p-channel transistor;
   a first enable transistor, wherein the first n-channel transistor, the first p-channel transistor, and the first enable transistor are connected in series between a first reference potential and a second reference potential, and wherein the first enable transistor is located between the first n-channel transistor and the first p-channel transistor;
   a second enable transistor, wherein the second n-channel transistor, the second p-channel transistor, and the second enable transistor are connected in series between the first reference potential and the second reference potential, and wherein the second enable transistor is located between the second n-channel transistor and the second p-channel transistor;
   a first pass gate configured to selectively connect a first bitline to a first node, wherein the first node is connected to a gate of the first n-channel transistor and a gate of the first p-channel transistor, and wherein the first enable transistor is controlled by the first bitline; and
   a second pass gate configured to selectively connect a second bitline to a second node, wherein the second node is connected to a gate of the second n-channel transistor and a gate of the second p-channel transistor, and wherein the second enable transistor is controlled by the second bitline.

2. The SRAM cell of claim 1, wherein the first pass gate and the second pass gate are controlled by a wordline.

3. The SRAM cell of claim 1, wherein:
   the first pass gate comprises a first pass transistor, and
   the second pass gate comprises a second pass transistor.

4. The SRAM cell of claim 3, wherein each of the first n-channel transistor, the second n-channel transistor, the first p-channel transistor, the second p-channel transistor, the first enable transistor, the second enable transistor, the first pass transistor, and the second pass transistor is implemented as a fin field-effect transistor (FinFET).

5. The SRAM cell of claim 3, wherein each of the first n-channel transistor, the second n-channel transistor, the first p-channel transistor, the second p-channel transistor, the first enable transistor, the second enable transistor, the first pass transistor, and the second pass transistor is implemented as a fin field-effect transistor (FinFET) having a single fin.

6. The SRAM cell of claim 1, wherein:
   the first bitline is connected to a gate of the first enable transistor, and
   the second bitline is connected to a gate of the second enable transistor.

7. The SRAM cell of claim 1, wherein while the SRAM cell is not being read from or written to, (i) the first bitline is driven to a voltage level that enables the first enable transistor and (ii) the second bitline is driven to a voltage level that enables the second enable transistor.

8. The SRAM cell of claim 1, wherein the first reference potential is $V_{DD}$ and the second reference potential is one of ground and $V_{SS}$.

9. The SRAM cell of claim 1, wherein the second reference potential is $V_{DD}$ and the first reference potential is one of ground and $V_{SS}$.

10. The SRAM cell of claim 1, wherein:
    the first pass gate comprises a third n-channel transistor, and
    the second pass gate comprises a fourth n-channel transistor.

11. The SRAM cell of claim 10, wherein:
    the first enable transistor comprises a third p-channel transistor, and
    the second enable transistor comprises a fourth p-channel transistor.

12. The SRAM cell of claim 1, wherein:
    the first pass gate comprises a third p-channel transistor, and
    the second pass gate comprises a fourth p-channel transistor.

13. The SRAM cell of claim 12, wherein:
    the first enable transistor comprises a third n-channel transistor, and
    the second enable transistor comprises a fourth n-channel transistor.

14. A method of operating a static random access memory (SRAM) cell including a bitline, an inverted bitline, and a wordline, the method comprising:
    in response to receiving a read request for the SRAM cell, (i) floating the bitline and the inverted bitline, (ii) asserting the wordline, (iii) determining a state of the SRAM cell from the bitline and the inverted bitline, (iv) de-asserting the wordline, and
    (v) responding to the read request based on the determined state of the SRAM cell;
    in response to receiving a write request for the SRAM cell, (i) driving the bitline and the inverted bitline according to a value provided in the write request, (ii) asserting the wordline, and (iii) de-asserting the wordline subsequent to asserting the wordline; and
    subsequent to de-asserting the wordline, driving the bitline and the inverted bitline to a predetermined voltage until a subsequent read or write request is received, wherein the SRAM cell includes a pair of cross-coupled inverters, a pair of pass gates, and a pair of enable transistors, and wherein the predetermined voltage is calculated to turn on the enable transistors.

15. The method of claim 14, wherein the pair of enable transistors are p-channel transistors, and wherein the predetermined voltage is a low voltage.

16. The method of claim 15, wherein the low voltage is a ground potential.

* * * * *